United States Patent
Morise et al.

(10) Patent No.: US 7,889,543 B2
(45) Date of Patent: Feb. 15, 2011

(54) MAGNETIC MEMORY ELEMENT AND MAGNETIC MEMORY APPARATUS

(75) Inventors: Hirofumi Morise, Kanagawa-ken (JP);
Shiho Nakamura, Kanagawa-ken (JP);
Yuichi Ohsawa, Kanagawa-ken (JP);
Satoshi Yanagi, Kanagawa-ken (JP);
Daisuke Saida, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 98 days.

(21) Appl. No.: 12/379,402

(22) Filed: Feb. 20, 2009

(65) Prior Publication Data

US 2009/0213638 A1     Aug. 27, 2009

(30) Foreign Application Priority Data

Feb. 21, 2008 (JP) ............................ P2008-039772

(51) Int. Cl.
*G11C 11/02* (2006.01)
(52) U.S. Cl. ....................................... 365/158; 365/173
(58) Field of Classification Search .................. 365/55, 365/97
See application file for complete search history.

(56) References Cited

U.S. PATENT DOCUMENTS

| | | | |
|---|---|---|---|
| 5,695,864 A | 12/1997 | Slonczewski | |
| 6,285,581 B1 | 9/2001 | Tehrani et al. | |
| 6,469,926 B1 | 10/2002 | Chen | |
| 6,538,297 B2 | 3/2003 | Odagawa et al. | |
| 6,590,806 B1 | 7/2003 | Bhattacharyya | |
| 6,603,677 B2 | 8/2003 | Redon et al. | |
| 6,639,830 B1 | 10/2003 | Heide | |
| 6,703,249 B2 | 3/2004 | Okazawa et al. | |
| 6,714,444 B2 * | 3/2004 | Huai et al. | ............... 365/171 |
| 6,873,542 B2 | 3/2005 | Gider et al. | |
| 6,906,949 B1 | 6/2005 | Nakamura et al. | |

(Continued)

FOREIGN PATENT DOCUMENTS

CN       1308317       8/2001

(Continued)

OTHER PUBLICATIONS

F.J. Albert et al., "Spin-Polarized Current Switching of a Co Thin Film Nanomagnet," Applied Physics Letters, vol. 77, No. 23, pp. 3809-3811, Dec. 4, 2000.

(Continued)

*Primary Examiner*—Tan T. Nguyen
(74) *Attorney, Agent, or Firm*—Nixon & Vanderhye PC

(57) ABSTRACT

A magnetic memory element is provided with first and second ferromagnetic fixed layers, a ferromagnetic memory layer, nonmagnetic first and second intermediate layers. The memory layer is disposed between the first and second fixed layers, and has a variable magnetization direction. In order to cancel asymmetry of a write-in current of the element, the element is provided so that the memory layer receives a larger perpendicular stray field from the first fixed layer than from the second fixed layer, and then a magnetization direction of a portion of the memory layer being nearest to the first intermediate layer and the magnetization direction of the first fixed layer are antiparallel to each other whenever a magnetization direction of a portion of the memory layer being nearest to the second intermediate layer and the magnetization direction of the second fixed layer are parallel to each other, and vice versa.

6 Claims, 19 Drawing Sheets

U.S. PATENT DOCUMENTS

| | | | |
|---|---|---|---|
| 6,956,766 | B2 | 10/2005 | Nakamura et al. |
| 6,967,863 | B2 | 11/2005 | Huai |
| 6,987,653 | B2 | 1/2006 | Inomata et al. |
| 7,119,410 | B2 | 10/2006 | Saito et al. |
| 7,120,049 | B2 | 10/2006 | Nakamura et al. |
| 7,126,848 | B2 | 10/2006 | Nakamura et al. |
| 7,126,849 | B2 | 10/2006 | Nakamura et al. |
| 7,372,727 | B2 | 5/2008 | Nakamura et al. |
| 7,486,486 | B2 | 2/2009 | Nakamura et al. |
| 7,486,552 | B2 * | 2/2009 | Apalkov et al. ............. 365/173 |
| 2007/0086121 | A1 | 4/2007 | Nagase et al. |

FOREIGN PATENT DOCUMENTS

| | | |
|---|---|---|
| CN | 1346155 | 4/2002 |

OTHER PUBLICATIONS

J. Grollier et al., "Spin-Polarized Current Induced Switching in Co/Cu/Co Pillars," Applied Physics Letters, vol. 78, No. 23, pp. 3663-3665, Jun. 4, 2001.

"Novel Multilayer Configuration for Experiments of Spin Precession Induced by a DC Current," 2002 MMM Abstract, p. 248, EQ-05 (47$^{th}$ Annual Conference of Magnetism & Magnetic Materials held on Nov. 11-15, 2002).

Nakamura et al., U.S. Appl. No. 10/721,549, filed Nov. 26, 2003.
Nakamura et al., U.S. Appl. No. 11/213,865, filed Aug. 30, 2005.
Nakamura et al., U.S. Appl. No. 11/227,493, filed Sep. 16, 2005.
Nakamura et al., U.S. Appl. No. 11/328,112, filed Jan. 10, 2006.
Nakamura et al., U.S. Appl. No. 11/405,418, filed Apr. 18, 2006.

* cited by examiner case $\Delta H_S = H_{S1} - H_{S2} > 0$ case $\Delta H_S = H_{S1} - H_{S2} < 0$

MAGNETIC MEMORY ELEMENT AND MAGNETIC MEMORY APPARATUS

CROSS REFERENCE TO RELATED APPLICATION

The application is based upon and claims the benefit of priority from the prior Japanese Patent Application No. 2008-039772, filed on Feb. 21, 2008, the entire contents of which are incorporated herein by reference.

FIELD OF THE INVENTION

The invention relates to a magnetic memory element and a magnetic memory apparatus.

DESCRIPTION OF THE BACKGROUND

In recent years, there has been a growing demand for information processing devices that meet various requirements for the extensively and highly advanced information society. In particular, hard disk drives and magnetoresistive random access memories (MRAMs) are memory devices based on magnetic moments of ferromagnetic materials. Such spin-electronic devices using spin degree-of-freedom of electrons are suitable for increasing integration by downsizing memory cells, operable at high speed, and nonvolatile. Hence their use will further expand in memory apparatuses and other applications. As one of controlling methods for a magnetization direction of small magnetic elements in spin-electronics devices, the use of a current-induced spin transfer phenomenon has been known. The "spin transfer" refers to the transfer of angular momenta from spins of conduction electrons to localized magnetic moments in the magnetic elements. In contrast to the scheme based on magnetic field applications, the spin transfer scheme is characterized in that a write-in current can be reduced with downsizing magnetic memory cells.

The technical subject about the spin transfer write-in for a magnetic element using perpendicularly magnetizable materials has been disclosed in Japanese laid-open patent application JP-A 2004-193595 (Kokai). An as-deposited multilayer film with a magnetic fixed layer (hereinafter referred as a "fixed layer"), an intermediate layer and a magnetic free layer (hereinafter referred as a "memory layer") laminated is patterned into dots, each being tens to hundreds of nanometers square to be a magnetic element. The shape of the magnetic element adapted to the spin transfer write-in is illustratively a pillar dot. Passing a current through the multilayer film in the direction perpendicular to the film surface provides control (write-in) and detection (read-out) of the magnetization of the memory layer, leading to use of the element as a magnetic memory element.

The use of perpendicularly magnetizable materials provides the memory element with thermal stability, eliminating needs of shape anisotropy, the magnetic memory element thus being suitable for high integration. The magnetic memory element using perpendicularly magnetizable materials adapted to the spin transfer write-in tends to reverse its magnetization efficiently when providing the memory element with two fixed layers per a memory layer. Adjusting one of the two intermediate layers and the other to a barrier layer and a conductive layer, respectively, differentiates the currents over positive/negative directions for the magnetization reversal of the element. Such asymmetry of reversal current enlarges only a one-direction current, increasing a breakdown risk of the memory element. The asymmetry also lowers the other direction current, creating a risk of a wrong write-in at the time of read-out. A magnetic memory apparatus using such elements must be provided with several power supplies corresponding to each greatly different reversal current value, possibly resulting in a cost overrun.

U.S. Pat. No. 6,967,863B-2 discloses a technical subject about a magnetic element adapted to the spin transfer write-in using perpendicularly magnetizable materials, but does not refer to the above-mentioned asymmetry or an answer to it. A magnetic element using perpendicularly magnetizable materials is disclosed in Japanese laid-open patent application JP-A 2007-142364 (Kokai).

SUMMARY OF THE INVENTION

An object of the invention is to provide a memory element being capable of canceling asymmetry of reversal current, reducing an element break-down risk, and being suitable for high integration, and also to provide a highly reliable and low-cost magnetic memory apparatus using the same.

To achieve the above object and according to one aspect of the invention, a magnetic memory element comprising a multilayer having a working surface, a first fixed layer, a second fixed layer, a memory layer, a first intermediate layer and a second intermediate layer. The working surface is defined as a surface perpendicular to a laminating direction of the fist fixed layer, second fixed layer, memory layer, first intermediate layer and second intermediate layer. The first fixed layer contains a first ferromagnetic material and has a first magnetization direction fixed substantially perpendicular to the working surface. The second fixed layer contains a second ferromagnetic material and has a second magnetization direction fixed substantially in a direction opposite to the first magnetization direction. The memory layer is disposed between the first fixed layer and the second fixed layer. The memory layer contains a third ferromagnetic material and has a magnetization direction that is variable. The first intermediate layer is disposed between the first fixed layer and the memory layer, and made essentially of nonmagnetic materials. The nonmagnetic materials include insulators and semiconductors. The second intermediate layer is disposed between the second fixed layer and the memory layer, and is nonmagnetic. The magnetization direction of a portion in the memory layer being nearest to the first intermediate layer and the magnetization direction of the first fixed layer are antiparallel to each other whenever the magnetization direction of a portion in the memory layer being nearest to the second fixed layer and the magnetization direction of the second fixed layer are parallel to each other, and vice versa. The memory layer receives a larger perpendicular component of a stray field from the first fixed layer than from the second fixed layer. A current is configured to be passed bi-directionally between the first fixed layer and the second fixed layer. The current is passed in a first direction over a first threshold to make the magnetization direction of the memory layer in the first direction. The current is passed in a second direction over a second threshold to make the magnetization direction of the memory layer in a direction opposite to the first direction. A current is passed between the first fixed layer and the second fixed layer to detect the magnetization direction of the memory layer. An electric conductivity of a nonmagnetic material to constitute the first intermediate layer is lower than that of a nonmagnetic material to constitute the second intermediate layer.

To achieve the above object and according to one aspect of the invention, other aspect of the invention is to provide a magnetic memory element comprising a multilayer having a working surface, a first fixed layer, a second fixed layer, a memory layer, a first intermediate layer and a second intermediate layer. The working surface is defined as a surface perpendicular to a laminating direction of the fist fixed layer, second fixed layer, memory layer, first intermediate layer and second intermediate layer. The first fixed layer contains a first ferromagnetic material and has a first magnetization direction fixed substantially perpendicular to the working surface. The second fixed layer contains a second ferromagnetic material and has a second magnetization direction fixed substantially in a direction opposite to the first magnetization direction. The memory layer is disposed between the first fixed layer and the second fixed layer. The memory layer contains a third ferromagnetic material and has a magnetization direction that is variable. The first intermediate layer is disposed between the first fixed layer and the memory layer, and made essentially of nonmagnetic materials. The nonmagnetic materials include insulators and semiconductors. The second intermediate layer is disposed between the second fixed layer and the memory layer, and is nonmagnetic. The magnetization direction of a portion in the memory layer being nearest to the first intermediate layer and the magnetization direction of the first fixed layer are antiparallel to each other whenever the magnetization direction of a portion in the memory layer being nearest to the second fixed layer and the magnetization direction of the second fixed layer are parallel to each other, and vice versa. The memory layer receives a larger perpendicular component of a stray field from the first fixed layer than from the second fixed layer. A current is configured to be passed bi-directionally between the first fixed layer and the second fixed layer. The current is passed in a first direction over a first threshold to make the magnetization direction of the memory layer in the first direction. The current is passed in a second direction over a second threshold to make the magnetization direction of the memory layer in a direction opposite to the first direction. A current is passed between the first fixed layer and the second fixed layer to detect the magnetization direction of the memory layer. An electric conductivity of a nonmagnetic material to constitute the first intermediate layer is lower than that of a nonmagnetic material to constitute the second intermediate layer. A thickness of the first intermediate layer is 1 nm or less. The first fixed layer includes N first ferromagnetic sublayers (N is an integer of 1 or more). The second fixed layer includes M second ferromagnetic sublayers (M is an integer of 1 or more). The memory layer includes P memory ferromagnetic sublayers (P is an integer of 1 or more). The mathematical formula 2 including the function $\phi(a, b, c)$ defined by the mathematical formula 1 is satisfied by $a_{1i}$, $b_{1i}$, $t_{1i}$, $a_{2j}$, $b_{2j}$, $t_{2j}$, $d_{1ik}$, $d_{2jk}$, $M_{1i}$, $M_{2j}$, $M_{sk}$ and $H_{Kk}$ when an i-th first ferromagnetic sublayer of the N first ferromagnetic sublayers is approximated by a i-th first rectangular parallelepiped; a j-th second ferromagnetic sublayer of the M second ferromagnetic sublayers is approximated by a j-th second rectangular parallelepiped; $a_{1i}$, $b_{1i}$ and $t_{1i}$ represent a height, a width and a thickness of the i-th first rectangular parallelepiped, respectively; $M_{1i}$ represents saturation magnetization of the i-th first ferromagnetic sublayer; $a_{2j}$, $b_{2j}$ and $t_{2j}$ represent a height, a width and a thickness of the j-th second rectangular parallelepiped, respectively; $M_{2j}$ represents saturation magnetization of the j-th second ferromagnetic sublayer; $M_{sk}$ and $H_{Kk}$ represent saturation magnetization and an anisotropy field of a k-th memory ferromagnetic layer of the P memory ferromagnetic sublayers, respectively; $d_{1ik}$ represents a distance between the i-th first ferromagnetic sublayer and the k-th memory ferromagnetic sublayer; $d_{2jk}$ represents a distance between the j-th second ferromagnetic sublayer and the k-th memory ferromagnetic sublayer.

$$\phi(a, b, d) = \frac{2}{\pi} \times \arctan\left(\frac{ab}{2d\sqrt{a^2 + b^2 + 4d^2}}\right) \quad \text{[formula 1]}$$

$$0.75 \times \sum_{k=1}^{P} \sum_{i=1}^{N} 2\pi M_{1i} \begin{pmatrix} \phi(a_{1i}, b_{1i}, d_{1ik}) - \\ \phi(a_{1i}, b_{1i}, t_{1i} + d_{1ik}) \end{pmatrix} - $$
$$0.75 \times \sum_{k=1}^{P} \sum_{j=1}^{M} 2\pi M_{2j} \begin{pmatrix} \phi(a_{2j}, b_{2j}, d_{2jk}) - \\ \phi(a_{2j}, b_{2j}, t_{2j} + d_{2jk}) \end{pmatrix} \geq $$
$$0.052 \times \sum_{k=1}^{P} (H_{Kk} - 4\pi M_{Sk}) \quad \text{[formula 2]}$$

To achieve the above object and according to one aspect of the invention, other aspect of the invention is to provide a magnetic memory element comprising a multilayer having a working surface, a first fixed layer, a second fixed layer, a memory layer, a first intermediate layer and a second intermediate layer. The working surface is defined as a surface perpendicular to a laminating direction of the fist fixed layer, second fixed layer, memory layer, first intermediate layer and second intermediate layer. The first fixed layer contains a first ferromagnetic material and has a first magnetization direction fixed substantially perpendicular to the working surface. The second fixed layer contains a second ferromagnetic material and has a second magnetization direction fixed substantially in a direction opposite to the first magnetization direction. The memory layer is disposed between the first fixed layer and the second fixed layer. The memory layer contains a third ferromagnetic material and has a magnetization direction that is variable. The first intermediate layer is disposed between the first fixed layer and the memory layer, and made essentially of nonmagnetic materials. The nonmagnetic materials include insulators and semiconductors. The second intermediate layer is disposed between the second fixed layer and the memory layer, and is nonmagnetic. The magnetization direction of a portion in the memory layer being nearest to the first intermediate layer and the magnetization direction of the first fixed layer are antiparallel to each other whenever the magnetization direction of a portion in the memory layer being nearest to the second fixed layer and the magnetization direction of the second fixed layer are parallel to each other, and vice versa. A current is configured to be passed bi-directionally between the first fixed layer and the second fixed layer. The current is passed in a first direction over a first threshold to make the magnetization direction of the memory layer in the first direction. The current is passed in a second direction over a second threshold to make the magnetization direction of the memory layer in a direction opposite to the first direction. A current is passed between the first fixed layer and the second fixed layer to detect the magnetization direction of the memory layer. An electric conductivity of a nonmagnetic material to constitute the first intermediate layer is lower than that of a nonmagnetic material to constitute the second intermediate layer. A thickness of the first intermediate layer is 1 nm or less. The first fixed layer includes N first ferromagnetic sublayers (N is an integer of 1 or more). The second fixed layer includes M second ferromagnetic sublayers (M is an integer of 1 or more). The memory layer includes P memory ferromagnetic sublayers (P is an integer of 1 or more). The mathematical formula 3 including the function $\phi(a, b, c)$ defined by the mathematical formula 1 is satisfied by $a_{1i}$, $b_{1i}$, $t_{1i}$, $a_{2j}$, $b_{2j}$, $t_{2j}$, $d_{1ik}$, $d_{2jk}$, $M_{1i}$, $M_{2j}$, $M_{sk}$ and $H_{Kk}$ when an i-th first ferromagnetic sublayer of the N first ferromagnetic sublayers is approximated by a i-th first rectangular parallelepiped; a j-th second ferromagnetic sublayer of the M second ferromagnetic sublayers is approximated by a j-th second rectangular parallelepiped; $a_{1i}$, $b_{1i}$ and $t_{1i}$ represent a height, a width and a thickness of the i-th first rectangular parallelepiped, respectively; $M_{1i}$ represents saturation magnetization of the i-th first ferromagnetic sublayer; $a_{2j}$, $b_{2j}$ and $t_{2j}$ represent a height, a width and a thickness of the j-th second rectangular parallelepiped, respectively; $M_{2j}$ represents saturation magnetization of the j-th second ferromagnetic sublayer; $M_{Sk}$ and $H_{Kk}$ represent saturation magnetization and an anisotropy field of a k-th memory ferromagnetic layer of the P memory ferromagnetic sublayers, respectively; $d_{1ik}$ represents a distance between the i-th first ferromagnetic sublayer and the k-th memory ferromagnetic sublayer; $d_{2jk}$ represents a distance between the j-th second ferromagnetic sublayer and the k-th memory ferromagnetic sublayer.

$$\phi(a, b, d) = \frac{2}{\pi} \times \arctan\left(\frac{ab}{2d\sqrt{a^2 + b^2 + 4d^2}}\right) \quad \text{[formula 1]}$$

$$0.75 \times \sum_{k=1}^{P} \sum_{i=1}^{N} 2\pi M_{1i} \binom{\phi(a_{1i}, b_{1i}, d_{1ik}) -}{\phi(a_{1i}, b_{1i}, t_{1i} + d_{1ik})} - \quad \text{[formula 3]}$$

$$0.75 \times \sum_{k=1}^{P} \sum_{j=1}^{M} 2\pi M_{2j} \binom{\phi(a_{2j}, b_{2j}, d_{2jk}) -}{\phi(a_{2j}, b_{2j}, t_{2j} + d_{2jk})} \geq$$

$$0.18 \times \sum_{k=1}^{P} (H_{Kk} - 4\pi M_{Sk})$$

To achieve the above advantage, other aspect of the invention is to provide a magnetic memory apparatus comprising a plurality of word lines, a plurality of bit lines and a plurality of the elements described above. One of the elements is selected by selecting one of the word lines and one of the bit lines to pass a current between the first fixed layer and the second fixed layer of the element selected. The current allows it to detect a magnetoresistance effect between the memory layer and the first fixed layer.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF DRAWINGS

The accompanying drawings, which are incorporated in and constitute a part of this specification, illustrate embodiments of the invention and together with the description, serve to explain the principles of the invention.

DETAILED DESCRIPTION OF THE INVENTION

Figure 1A:
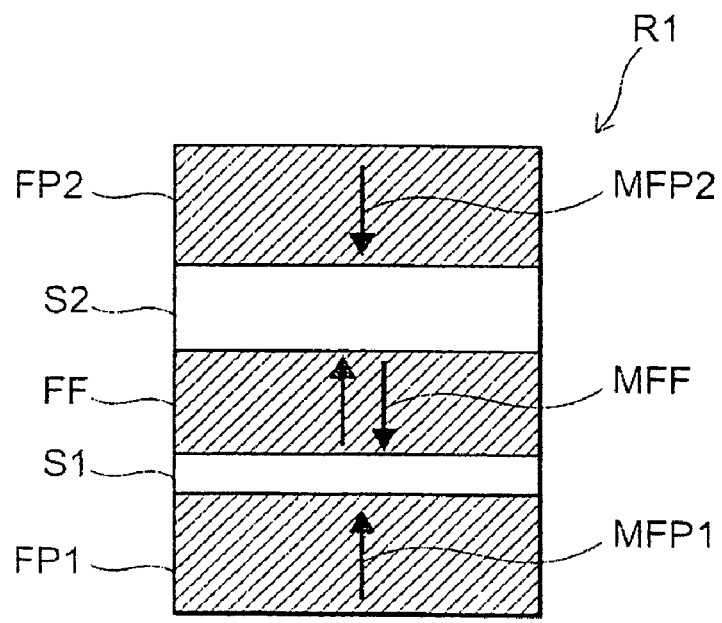
FIGS. 1A to 1D are schematic sectional views of a magnetic memory element according to a first embodiment of the invention.

Embodiments of the invention will be described below with reference to accompanying drawings. Wherever possible, the same reference numerals will be used to denote the same or like parts throughout figures.

First Embodiment

FIGS. 1A to 1D are schematic views showing a sectional structure of a magnetic memory element according to a first embodiment of the invention.

As shown in FIGS. 1A to 1D, magnetic memory elements R1 to R4 according to the first embodiment of the invention have a structure with a ferromagnetic layer FP1, a nonmagnetic layer S1, a ferromagnetic layer FF, a nonmagnetic layer S2 and a ferromagnetic layer FP2 laminated in this order. A planar shape of the magnetic memory elements R1 to R4 is, e.g., a quadrangle, and then the elements can be made three-dimensionally into combination of a square pole and a square pyramid. However, the magnetic memory element of the embodiment is not limited to a quadrangle concerning two-dimensional shapes, but can take various planer shapes, such as a circle, an ellipse, a polygon, an irregular polygon with a surface asperity and so on.

Each of the ferromagnetic layers FP1, FP2 and FF may include two or more sub-layers, as will be described later. First, each of the ferromagnetic layers FP1, FP2 and FF having a monolayer is taken as an example to be explained. In addition, the above-mentioned ferromagnetic layer FP1, nonmagnetic layer S1, ferromagnetic layer FF, nonmagnetic layer S2 and ferromagnetic layer FP2 may be provided, e.g., with or without a nonmagnetic layer on a substrate.

A magnetization direction of the ferromagnetic layer FP1 is fixed. This is realized by, e.g., preparing an antiferromagnetic layer AF1 (not shown in the figures) on one of the two surfaces of the ferromagnetic layer FP1, which is not nearest to the nonmagnetic layer S1. Here, the two surfaces of the ferromagnetic layer FP1 are parallel to a working surface. The working surface is defined as a surface perpendicular to a laminating direction of the fist and second fixed layers, memory layer and intermediate layers. Or the ferromagnetic layer FP1 may be provided also using a magnetic material with a very large uniaxial anisotropy constant $K_u$. Hereinafter, the ferromagnetic layer FP1 will be referred to as the "first fixed layer FP1".

A magnetization direction of the ferromagnetic layer FP2 is also fixed. This is realized by, e.g., preparing an antiferromagnetic layer AF2 (not shown in the figures) on one of the two surfaces of the ferromagnetic layer FP2, which is not nearest to the nonmagnetic layer S2. Here, the two surfaces of the ferromagnetic layer FP2 are parallel to the working surface, too. Or the ferromagnetic layer FP2 may be provided also using a ferromagnetic material with a very large uniaxial anisotropy constant $K_u$. Hereinafter, the ferromagnetic layer FP2 will be referred to as the "second fixed layer FP2" in some cases.

On the contrary, a magnetization direction of the ferromagnetic layer FF is not purposely fixed. Therefore, the magnetization direction of the ferromagnetic layer FF is variable. Hereinafter, the ferromagnetic layer FF will be referred to as the "memory layer FF".

The nonmagnetic layers S1 and S2 contain nonmagnetic materials, and have a layer thickness to isolate the two ferromagnetic layers sandwiching the nonmagnetic layer to an extent that a direct magnetic interaction between the two ferromagnetic layers is negligible. Furthermore, the thickness of the nonmagnetic layers S1 and S2 needs to be smaller than a spin diffusion length so that a spin direction of conduction electrons having passed through one ferromagnetic layer is not reversed until the conduction electrons reach the other ferromagnetic layer when a current is passed through the magnetic memory element. The nonmagnetic layers S1 and S2 will be hereinafter also referred to as the "first intermediate layer S1" and "second intermediate layer S2", respectively.

The first intermediate layer S1 contains semiconductors or insulators, and then functions as a barrier layer. The first fixed layer FP1, the first intermediate layer S1 and the memory layer FF are laminated so as to produce what is called a tunnel magnetoresistance effect. The first fixed layer FP1, the first intermediate layer S1 and the memory layer FF are also collectively referred to as a "tunnel magnetoresistance effect portion." On the other hand, a material more conductive than the first intermediate layer S1 is used for the second intermediate layer S2. Materials which can be used for the first and second intermediate layers S1 and S2 will be mentioned specifically later.

Electrodes EL1 and EL2 (not shown in the figures) are provided to be connected with the fixed layers FP1 and FP2, respectively, and passing a current between the two electrodes allows it to pass the current between both fixed layers FP1 and FP2. The current may be passed bi-directionally between the first and second fixed layers FP1 and FP2.

The element is fabricated using, e.g., sputtering and lithography techniques as specifically described later.

The arrows express a magnetization direction in FIGS. 1A to 1D. As illustrated in these figures, magnetization directions MFP1 and MFP2 of the first and second fixed layers FP1 and FP2 are fixed so as to be substantially perpendicular to the working surface defined above. Moreover, magnetization directions MFP1 and MFP2 of the first and second fixed layers FP1 and FP2 are fixed so as to be antiparallel to each other at any time. The magnetization direction MFF of the memory layer FF and the magnetization direction MFP2 of the second fixed layer FP2 are antiparallel to each other whenever the magnetization direction MFF of the memory layer FF and the magnetization direction MFP1 of the first fixed layer FP1 are parallel to each other, and vice versa.

Figure 1B:
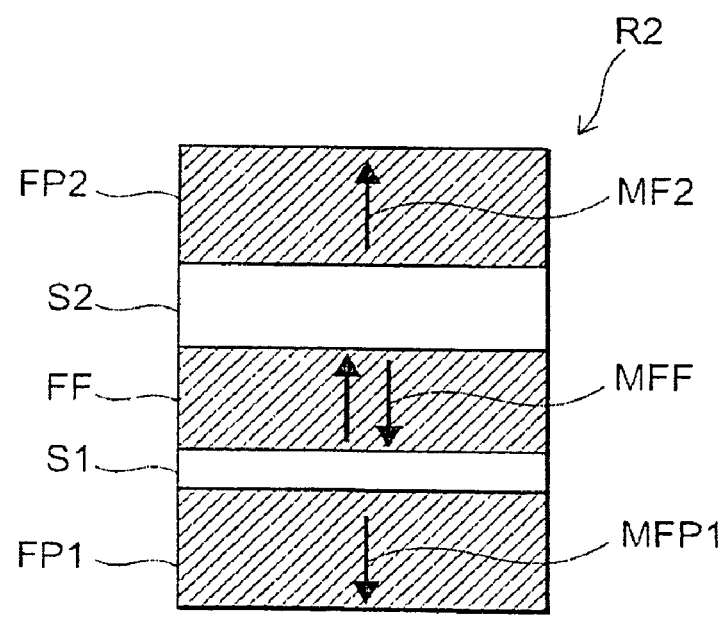
Figure 1C:
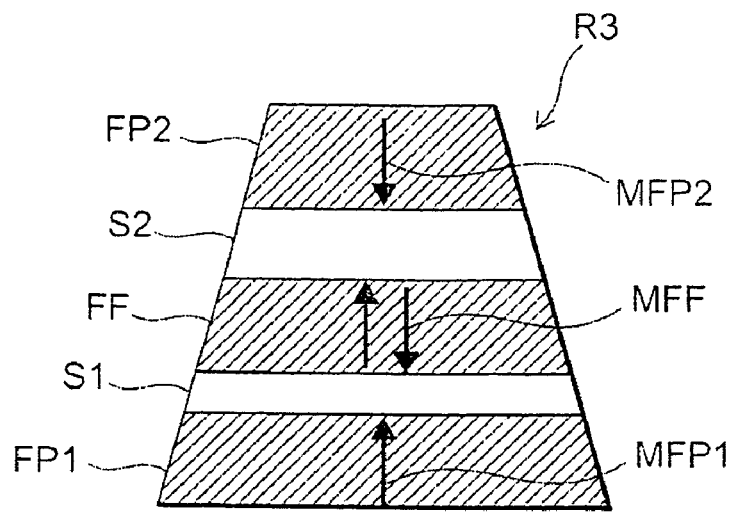
Figure 1D:
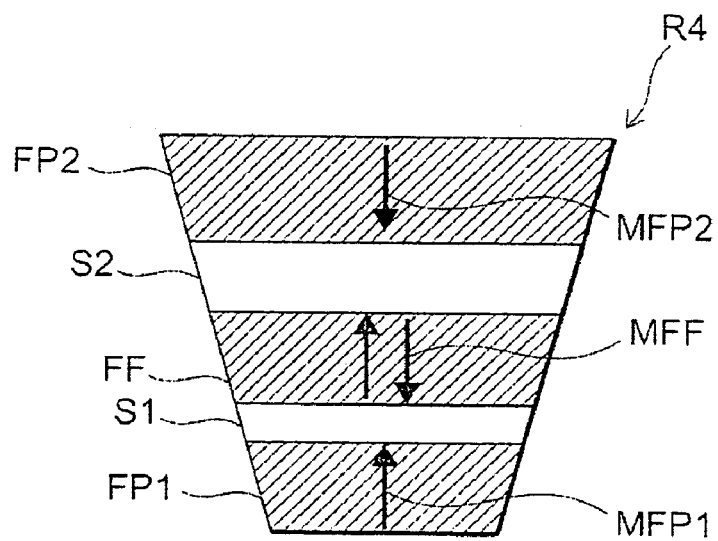

In addition, as illustrated in FIGS. 1A and 1B, the first fixed layer FP1, the first intermediate layer S1, the memory layer FF, the second intermediate layer S2, and the second fixed layer FP2 may have the same cross section (particularly the same width) substantially, or have a cross section different from each other, i.e., the width of each cross section may vary layer to layer. When each of the first fixed layer, second fixed layer and memory layer is formed using a synthetic antiferromagnetic coupling multilayer as will be explained later, the magnetization directions of the first and second fixed layers are defined as a magnetization direction of a portion (sublayer) of the first fixed layer nearest to the first intermediate layer and a magnetization direction of a portion (sublayer) of the second fixed layer nearest to the second intermediate layer, respectively. In this case, the memory layer has two different pairs of magnetization directions of portions (sublayers) nearest to the first and second intermediate layers. Then, it is possible to make these two pairs correspond to two magnetization directions of a single memory layer as shown in FIGS. 1A to 1D.

In the magnetic memory element according to the embodiment, magnetic stray fields are generated by the first and second fixed layers FP1 and FP2. A stray field generated by the first fixed layer FP1 reaches the memory layer FF more greatly than that generated by the second fixed layer FP2. This allows it to use the stray fields in order to control the asymmetry over positive/negative reversal current necessary for reversing magnetization of the memory layer. Use of the stray field reduces a difference between the currents to upward and downward reverse the magnetization of the memory layer FF.

The magnitude of the stray field from the fixed layers to the memory layer is explained for the magnetic memory element according to the embodiment.

When magnetization is distributed all over a region V according to M (r) (emu/cc), a magnetic field H(r) (Oe) in a position r are given by the following mathematical formula 4.

$$H(r) = grad\ div \int_v d^3 r' \frac{M(r')}{|r-r'|} \qquad \text{[formula 4]}$$

The formula 4 suggests that the memory layer receives a larger stray field from the fixed layer having larger magnetization or from the fixed layer nearer to the memory layer. However, only the perpendicular component of the stray field influences the asymmetry described above. The perpendicular component of the stray field means the stray-field component perpendicular to the working surface.

The stray fields, each generated by the first and second fixed layers FP1 and FP2, are calculated in order to estimate a total stray field which the memory layer FF receives. The stray fields depend on a shape and size of each fixed layer, and also on a distance "d" from each fixed layer. And the stray fields from the respective fixed layers are summed to obtain the total stray field.

FIGS. 2A to 2D are graphs illustrating distributions of stray fields that the memory layer receives from one of the fixed layers in the magnetic memory element according to the first embodiment of the invention.

Figure 2A:
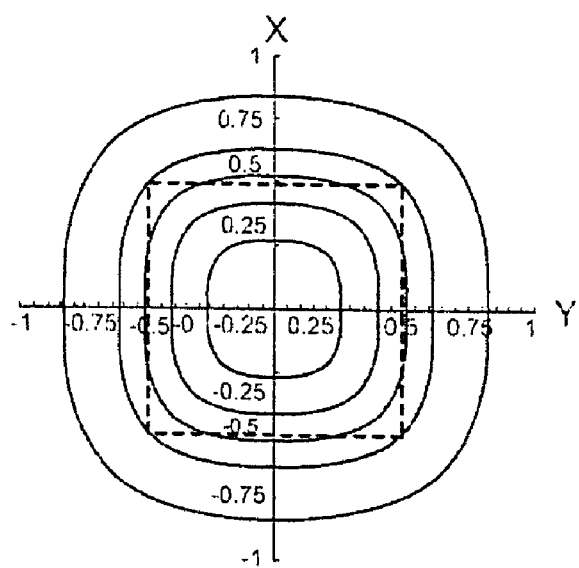
FIGS. 2A to 2D are graphs illustrating distributions of stray fields of the magnetic memory element according to the first embodiment of the invention.
Figure 2B:
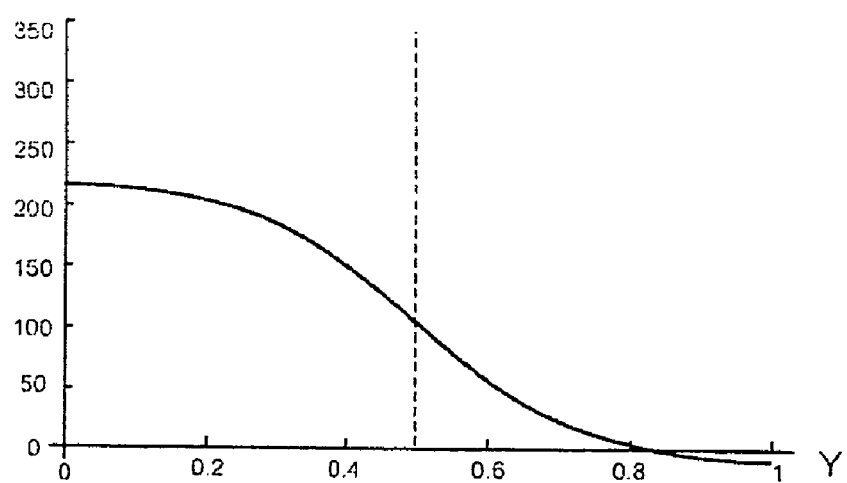
Figure 2C:
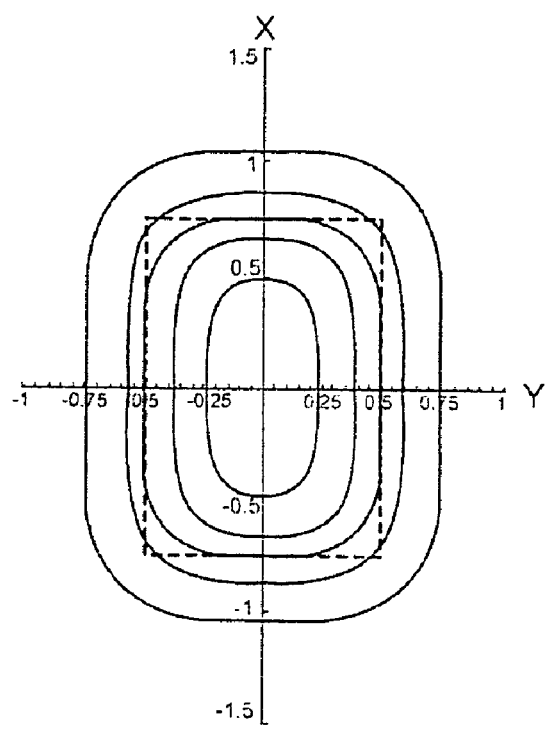

FIGS. 2A and 2C illustrate contours for a perpendicular component of the stray field at each position in a plane parallel to the film surface, i.e., the working surface which is the distance "d" away from the fixed layer, when the fixed layer is a rectangular parallelepiped that measures "a" wide by "b" long by "t" thick. The plane can be regarded as the memory layer virtually.

Figure 2D:
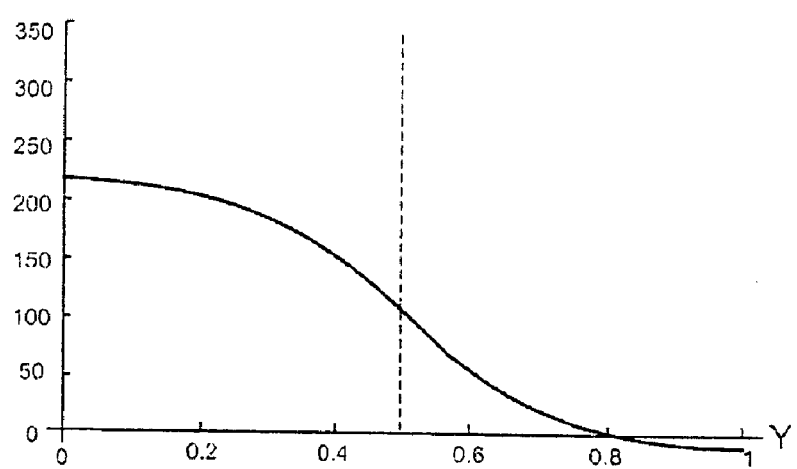

In FIGS. 2A and 2C, a region expressed by the dotted line corresponds to an edge line of the planer shape of the fixed layer. Moreover, FIGS. 2B and 2D are graphs illustrating a magnitude $H_s$ (x, 0) of the stray field on the axis of y=0 in FIGS. 2A and 2C. Here, the magnitude means an absolute value of a perpendicular component of the "vectorial" stray field. Hereinafter, the perpendicular component of the "vectorial" stray field is referred to as the "stray field" simply, the higher stray field meaning the larger perpendicular component of the "vectorial" stray field, for example. The horizontal axis represents a horizontal position x, and the vertical axis represents the magnitude $H_s$ of the stray field. In addition, a physical unit of the stray field is arbitrary. In FIGS. 2B and 2D, the vertical dotted line corresponds to the edge line of the fixed layer.

FIGS. 2A and 2B illustrate a case of a:b=1:1, and FIGS. 2C and 2D illustrate a case of a:b=1:1.5.

The characteristics shown in FIGS. 2A to 2D correspond to estimation of the stray field from one of the fixed layers that the memory layer FF receives when the intermediate layer with a thickness of "d" exists.

The memory layer FF receives the largest magnetic field from the fixed layers at the center of the magnetic memory element comprising the layer FF. The largest magnetic field is considered to be twice the field that the memory layer FF receives at an edge of the magnetic memory element. Therefore, the stray field will be estimated, assuming that the memory layer FF receives about 75% of the highest field constantly.

FIGS. 3A to 3E are schematic views illustrating shapes of the fixed layers of the magnetic memory element according to the first embodiment of the invention.

Figure 3C:
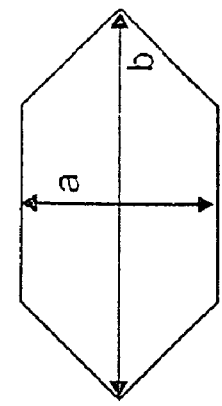
FIGS. 3A to 3E are schematic views illustrating shapes of the fixed layers of magnetic memory elements according to the first embodiment of the invention.
Figure 3B:
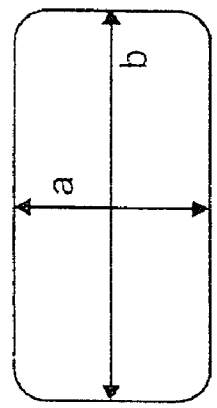
Figure 3E:
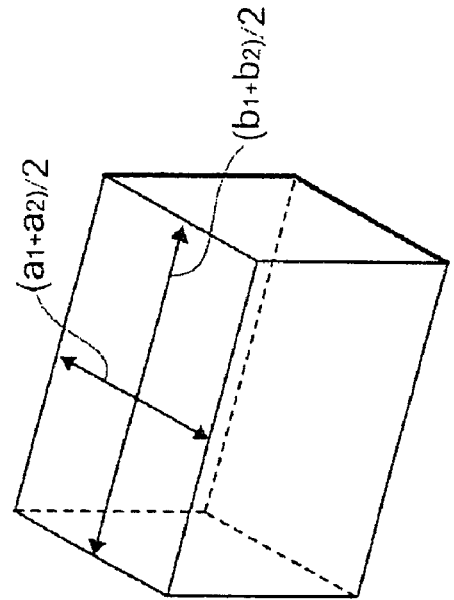
Figure 3A:
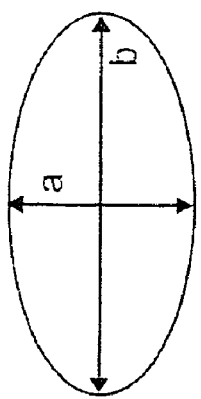

FIGS. 3A to 3C illustrate planer shapes of the fixed layer of the magnetic memory element according to the first embodiment of the invention. As illustrated in FIGS. 3A to 3C, the fixed layers can have various planer shapes.

Figure 3D:
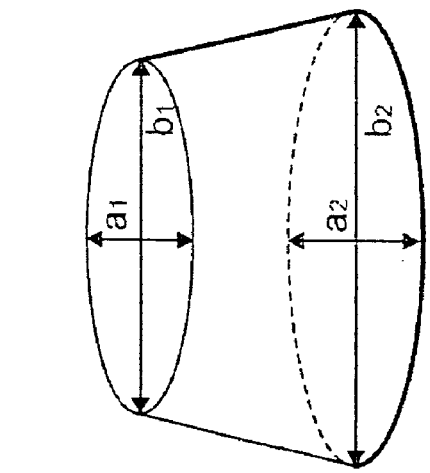

FIG. 3D is a perspective view schematically illustrating a solid shape of the fixed layer of the magnetic memory element according to the first embodiment of the invention. The solid shape of the fixed layer can be various, such as an elliptical cylinder and an elliptical cone stand, as illustrated in FIG. 3 (d). An approximating method of such shapes is explained using a rectangular parallelepiped.

FIG. 3E is a perspective view illustrating the rectangular parallelepiped by which the shape of the fixed layer is approximated three-dimensionally. As for a planer shape, "a" denotes a shortest length of the shape (e.g., a minor axis for an ellipsoid) and "b" denotes a length perpendicular to the direction in which the shortest length of the shape is defined (a major axis for the ellipsoid). If lengths, e.g., $a_1$ and $a_2$ are different from each other at an upper and lower bases, an average value $(a_1+a_2)/2$ of the two different lengths $a_1$ and $a_2$ will be used. Lengths $b_1$ and $b_2$ are ditto with $a_1$ and $a_2$. Thus, the width "a" and the length "b" of the approximated rectangular parallelepiped are used for the fixed layer. A layer thickness of the fixed layer is used for the height of the approximated rectangular parallelepiped.

The stray field from the fixed layer is estimated using this approximated rectangular parallelepiped. Using the mathematical formula 6, the magnitude $H_s$ of the stray field is expressed with the mathematical formula 5.

$$Hs(M; a, b, t; d) = 0.75 \times 2\pi M \left[ \begin{array}{c} \phi(a, b, d) - \\ \phi(a, b, d+t) \end{array} \right] \quad \text{[formula 5]}$$

$$\phi(a, b, d) = \frac{2}{\pi} \times \arctan\left( \frac{a/2 \cdot b/2}{d\sqrt{d^2 + (a/2)^2 + (b/2)^2}} \right) \quad \text{[formula 6]}$$

Figure 4A:
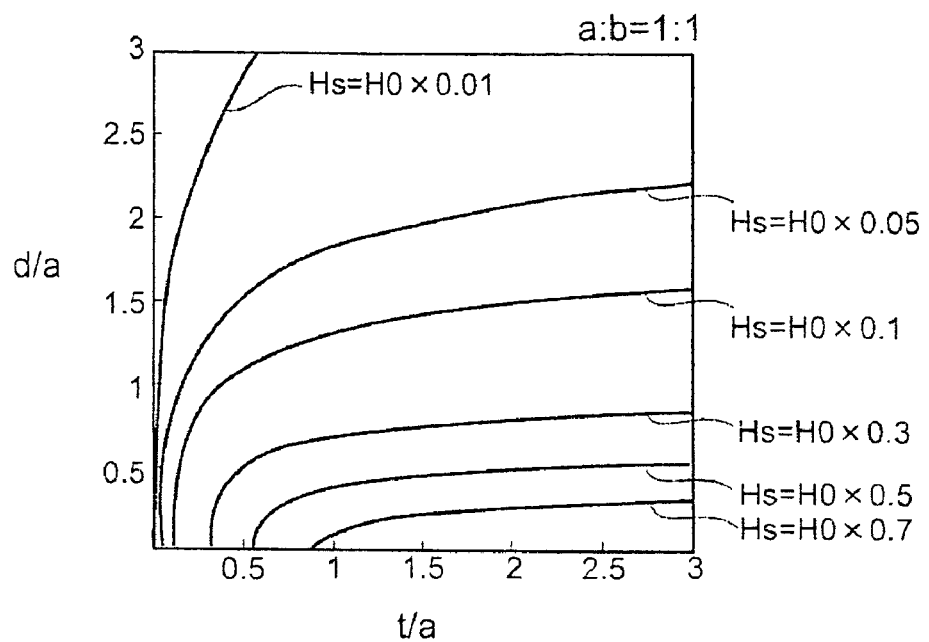
FIGS. 4A and 4B are graphs illustrating a simulation of stray fields in a magnetic memory element according to the first embodiment of the invention.
Figure 4B:
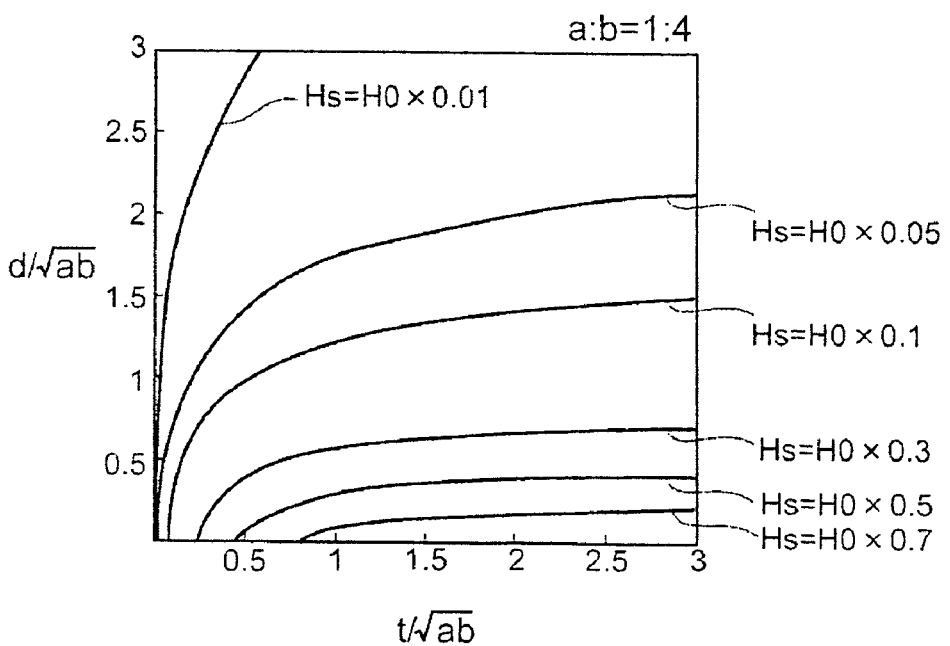

FIGS. 4A and 4B are graphs illustrating a simulation of the stray field in the magnetic memory element according to the first embodiment of the invention.

FIGS. 4A and 4B show cases of a:b=1:1 and a:b=1:4, respectively, for the planer shape of the fixed layer. In FIGS. 4A and 4B, the horizontal axes represent the layer thickness of the fixed layer. However, scales of the horizontal axes in FIGS. 4A and 4B are normalized by "a" and $(ab)^{1/2}$, respectively. The vertical axes represent the intermediate layer's thickness "d" (a distance from the fixed layer). Scales of the respective vertical axes are normalized by "a" and $(ab)^{1/2}$ as well. It is also assumed that $H_0=0.75\times2 \pi M_s$. Here, $M_s$ is saturation magnetization of the fixed layer. And the lines in the figures illustrate contour lines of the stray field $H_s$.

As shown in FIGS. 4A and 4B, the stray field becomes larger as the fixed layer with a thickness "t" is thicker or the intermediate layer with a thickness "d" is thinner, the memory layer receiving a greater magnitude of the stray field from the fixed layer.

A detecting method of a difference between the stray fields $H_{s1}$ and $H_{s2}$ is explained. The stray fields $H_{s1}$ and $H_{s2}$ are generated by the fixed layers FP1 and FP2, respectively, acting on the memory layer FF. That is, the memory layer FF receives both $H_{s1}$ and $H_{s2}$.

A current is passed between the first and second fixed layers FP1 and FP2 with applying an external magnetic field to the magnetic memory element to measure an electrical resistance between the first and second fixed layers FP1 and FP2, i.e., an electrical resistance of the element. The magnetization directions of the first and second fixed layers FP1 and FP2 are anti-parallel to each other, thus the directions of the stray field from each fixed layer being also anti-parallel to each other. The stray field $H_{s1}$ from the first fixed layer FP1 and the stray field $H_{s2}$ from the second fixed layer FP2 are taken so that each may become a positive value. Moreover, in FIGS. 5A and 5B mentioned later, a positive direction of the external magnetic field is taken so that the positive direction is same as that of the stray field from the fixed layer FP1. And the magnitude of the external field is varied gradually and the electrical resistance is measured at each external field varied. This measurement can provide the difference between the stray field $H_{s1}$ of the first fixed layer FP1 and the stray field $H_{s2}$ of the second fixed layer FP2.

Figure 5A:
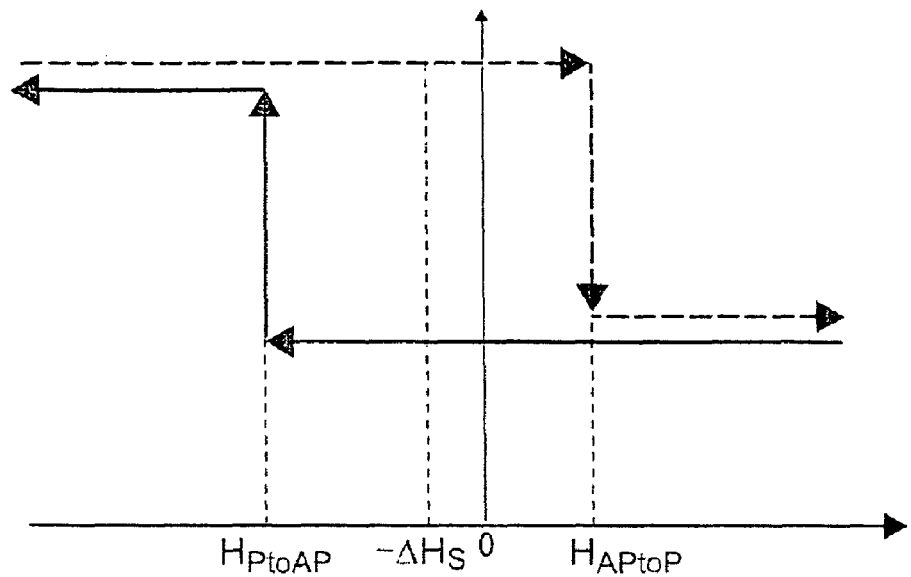
FIGS. 5A and 5B are graphs illustrating hysteresis loops of a magnetic memory element according to the first embodiment of the invention.
Figure 5B:
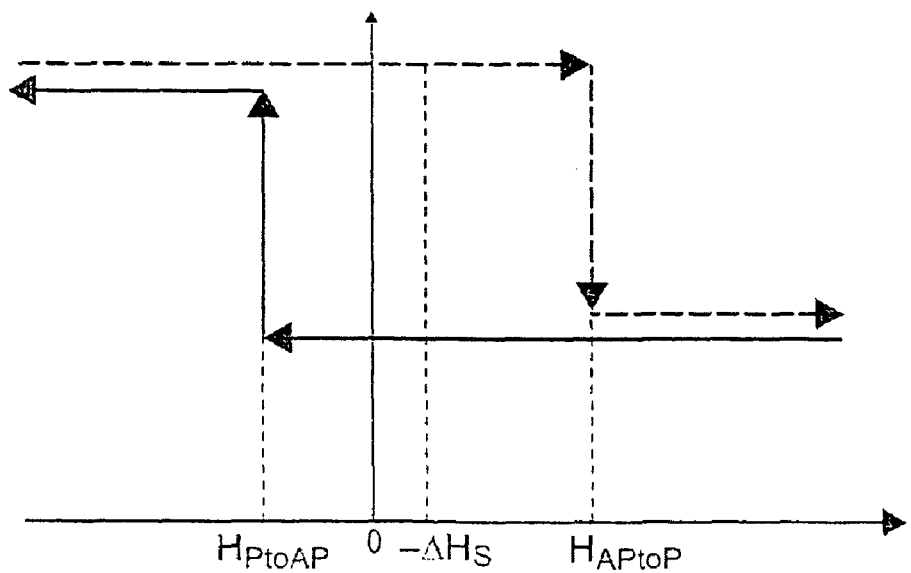

FIGS. 5A and 5B are graphs illustrating hysteresis loops of the magnetic memory element according to the first embodiment of the invention.

The horizontal axis represents the magnitude of the external field applied and the vertical axis represents whole magnetization of the magnetic memory element in FIG. 5. The whole magnetization of the memory element on the vertical axis is detected as an electrical resistance for the above-mentioned example. In FIGS. 5A and 5B, the stray field $H_{s1}$ from the first fixed layer FP1 and the stray field $H_{s2}$ from the second fixed layer FP2 are reversed mutually.

As shown in FIGS. 5A and 5B, a hysteresis curve is obtained as a characteristic of the magnetization of the memory element with respect to the external field applied from the outside. The tunnel magnetoresistance effect portion including the intermediate layer S1 mostly contributes to the electrical resistance. The resistance is low when the magnetization of the first fixed layer FP1 and the magnetization of the intermediate layer FF are parallel to each other, and is high when they are anti-parallel, as will be mentioned later in relation to read-out.

Directions of the stray fields $H_{s1}$ and $H_{s2}$ generated by the first and second fixed layers FP1 and FP2, respectively, are opposite to each other, both stray fields acting on the memory layer FF. Therefore, a center of the hysteresis curve shifts from an original point of the horizontal axis just to a degree of $\Delta H_s$ expressed by the following mathematical formula 7.

$$\Delta H_S = H_{S1} - H_{S2} \qquad \text{[formula 7]}$$

If $H_{s1} > H_{s2}$, the center of the hysteresis curve will shift in the negative direction, i.e., in a direction opposite to the magnetization of the first fixed layer FP1. If $H_{s1} < H_{s2}$, the center of the hysteresis curve will shift in the positive direction, i.e., in the same direction as the magnetization of the first fixed layer FP1.

Next, writing to the memory layer FF of the magnetic memory element R is explained.

Figure 6A:
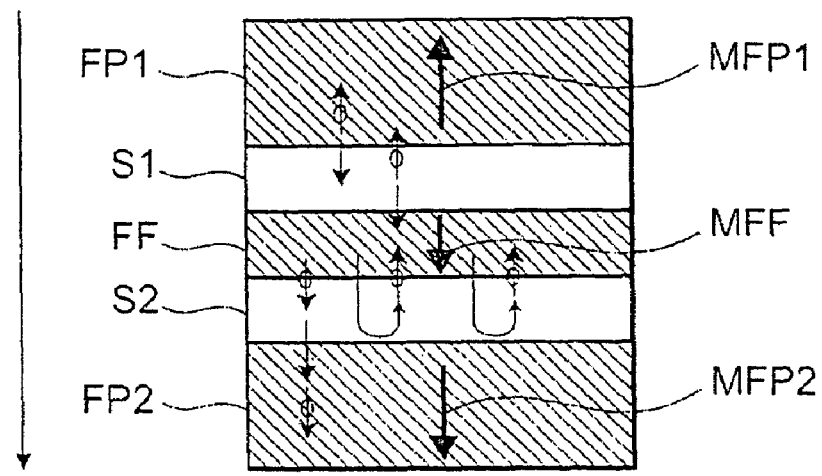
FIGS. 6A and 6B are schematic cross-sectional views explaining a principle of writing in a magnetic memory element according to the first embodiment of the invention.
Figure 6B:
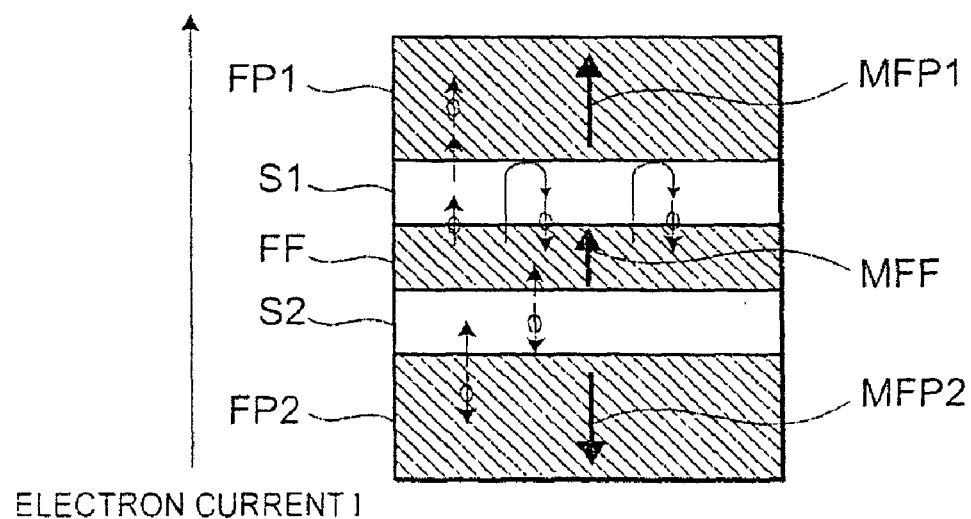

FIGS. 6A and 6B are schematic cross-sectional views explaining a writing principle of the magnetic memory element according to the first embodiment of the invention.

As shown in FIG. 6A, a current is passed in a direction from the first fixed layer FP1 to the second fixed layer FP2 in order to reverse the magnetization MFF of the memory layer FF which is anti-parallel to the magnetization direction MFP1 of the layer FP1 so as to make the two directions MMF and MFP1 parallel. Then, electrons having passed through the first fixed layer FP1 with the magnetization MFP1 tend to have a spin which has the same direction as the magnetization MFP1. When the electrons are passed through the memory layer FF, their spin angular momenta are transferred to the layer FF to act on the layer FF as torque that reverses the magnetization MFF of the memory layer FF in a direction parallel to the magnetization MFP1. Since the magnetization MFP2 of the second fixed layer FP2 is provided with a direction opposite to the magnetization MFP1, the electrons having a spin of which direction is the same (upwards in the figure) as the magnetization MFP1 is reflected at the interface between the second intermediate layer S2 and the second fixed layer FP2. The electrons thus reflected act also on the memory layer FF, as they have a spin of which direction is opposite to the magnetization MMF. This reflection at the interface allows the reflected electrons to act once again on the memory layer FF, resulting in a writing action twice as many or more substantially. The result mentioned above allows it to reduce a current for writing to the memory layer FF.

As shown in FIG. 6B, a current may be passed in a direction from the second fixed layer FP2 to the first fixed layer FP1 in order to reverse the magnetization MFF of the memory layer FF which is parallel to the magnetization MFP1 of the layer FP1 so as to make anti-parallel the two directions MMF and MFP1.

Passing a current with different polarities through the memory layer FF allows it to write in two different states to the magnetic memory element R.

It is preferable that a ratio $R = I_{c1}/I_{c2}$ of two reversal current thresholds is close to 1, while $R(0)$ ($\Delta H_s = 0$) tends to be more than 1 when no stray field acts. This is explained as follows. The ratio $R(0)$ of the reversal current thresholds can be expressed with the following mathematical formula 8. Here, $g(\theta)$ is a function of a relative angle $\theta$ that the magnetization MFF of the memory layer FF and the magnetization MFP1 of the first fixed layer FP1 do, representing an efficiency of the spin transfer. A relationship $g(0) > g(\pi)$ is justified in general for a structure of a fixed layer/barrier layer/memory layer/nonmagnetic layer/fixed layer, resulting in $R(0) > 1$.

$$R(0) = \frac{g(0)}{g(\pi)} \qquad \text{[formula 8]}$$

Expressing R as R ($\Delta H_s$) when the stray fields differ from each other by $\Delta H_s = H_{s1} - H_{s2}$ leads to the following mathematical formula 9 for a parameter defined as $\gamma(\Delta H_s) = R(\Delta H_s)/R(0)$.

$$\gamma(\Delta H_S) = \frac{H_K - 4\pi M_S - \Delta H_S}{H_K - 4\pi M_S + \Delta H_S} \qquad \text{[formula 9]}$$

If $\Delta H_s$ is a positive value, a relationship $\gamma(\Delta H_s) < 1$ is obtained to eliminate the asymmetry over positive/negative reversal current. What is necessary for improving the asymmetry by x % or more, i.e., satisfying $\gamma \leq (1 - x/100)$ is just to satisfy the following mathematical formula 10, assuming that the saturation magnetization and cubic volume of the first fixed layer FP1 approximated by a rectangular parallelepiped are M1 and $a_1 \times b_1 \times t_1$, respectively; the layer thickness of the first intermediate layer is $d_1$; the saturation magnetization and cubic volume of the second fixed layer FP2 approximated by a rectangular parallelepiped are M2 and $a_2 \times b_2 \times t_2$, respectively; the layer thickness of the second intermediate layer is $d_2$; the saturation magnetization and anisotropy field of the memory layer FF are $M_s$ and $H_k$, respectively.

$$H_S(M_1; a_1, b_1, t_1; d_1) - H_S(M_2; a_2, b_2, t_2; d_2) \geq C(x)(H_K - 4\pi M_S) \qquad \text{[formula 10]}$$

Here, the function $H_s$ is given by the formula 5.

The coefficient $C(x)$ is given by $C(x) = x/(200 - x)$ and its numerical values are specifically recited as $C(5) = 0.026$, $C(10) = 0.052$, $C(20) = 0.11$, $C(30) = 0.18$, $C(40) = 0.25$, $C(50) = 0.33$, $C(60) = 0.43$, $C(70) = 0.54$, $C(80) = 0.67$, $C(90) = 0.82$, and $C(100) = 1$.

It is preferable to make the first intermediate layer S1 with the thickness $d_1$ thinner than the second intermediate layer S2 with the thickness $d_2$, easing requirements to be met by other parameters. Making thicker the first intermediate layer S1 with the thickness $d_1$ increases the resistance of the memory element exponentially, leading to a high voltage applied on the first intermediate layer S1 at the time of writing to the memory layer FF. This creates a breakdown risk of insulation because of the high voltage. It is, therefore, preferable that the layer thickness $d_1$ of the first intermediate layer S1 is 1 nm or less.

It is preferable to make the saturation magnetization M1 of the first fixed layer FP1 higher than the saturation magnetization M2 of the second fixed layer FP2, easing requirements to be met by other parameters for the satisfaction of the formula 10. It is also preferable for the same reason to make the first fixed layer FP1 with the thickness $t_1$ thicker than the second fixed layer FP2 with the thickness $t_2$. In the formula 6, a large value of $(ab)^{1/2}$ lowers d-dependence of $\phi(a, b, d)$, resulting in the low stray field $H_s$ expressed by the formula 5. It is, therefore, preferable to make smaller and larger the sectional areas of the first and second fixed layers FP1 and FP2, respectively, resulting in a higher stray field $H_{s1}$ from the first fixed layer FP1 and a lower stray field $H_{S2}$ from the second fixed layer FP2.

Next, read-out of data bit from the magnetic memory element R is explained. Data bits are stored as magnetization directions MFF of the memory layer FF.

Passing a current in a direction in which electrons are passed from the first fixed layer FP1 toward the second fixed layer FP2 or in the reverse direction gives rise to an electrical resistance due to the magnetoresistance effect. The resistance depends on a relative angle between the magnetization direction of the memory layer FF and that of the fixed layer adjacent to the layer FF via the nonmagnetic layer.

The resistance reflects a resistance of the tunnel magnetoresistance effect portion including the memory layer FF/the first intermediate layer S1/the first fixed layer FP1 substantially. This is because a resistance of the first intermediate layer S1 is very high in comparison with that of the second intermediate layer S2 or interconnections.

Figure 7A:
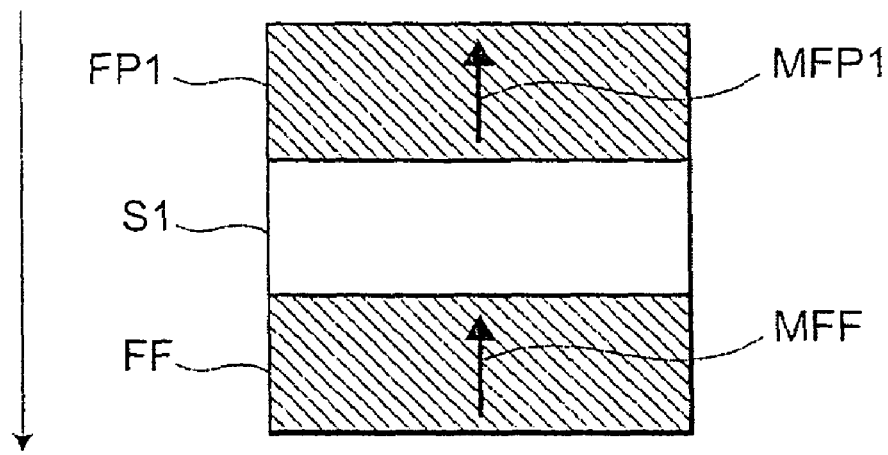
FIGS. 7A and 7B are schematic cross-sectional views for explaining a principle of read-out in the magnetic memory element according to the first embodiment of the invention.
Figure 7B:
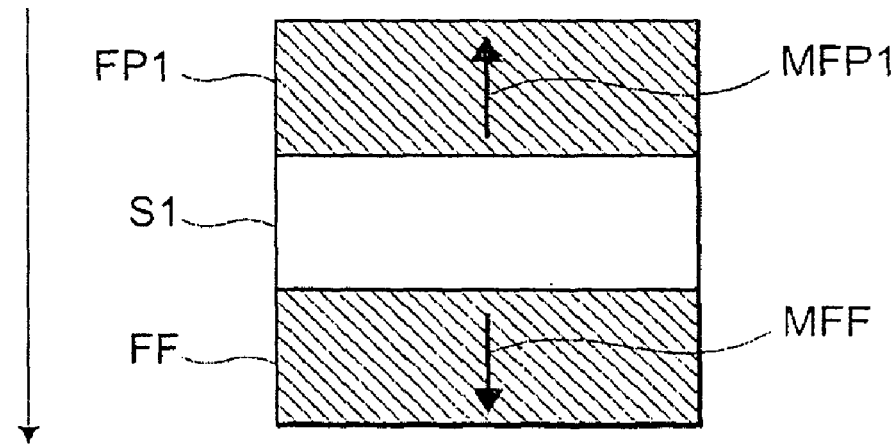

FIGS. 7A and 7B are cross-sectional views for schematically explaining a principle of the read-out operation in the magnetic memory element according to the first embodiment of the invention.

FIGS. 7A and 7B illustrate the tunnel magnetoresistance effect portion including the memory layer FF/the first intermediate layer S1/the first fixed layer FP1. When a sense current is passed in a direction in which electrons are passed from the first fixed layer FP1 toward the second fixed layer FP2 (memory layer FF), the resistance becomes normally lower when the magnetization MFP1 of the first fixed layer FP1 and the magnetization MMF of the memory layer FF are parallel than when they are anti-parallel, as shown in FIGS. 7A and 7B.

The data bit stored as a direction of the magnetization MFF of the memory layer FF can be read out using the above-mentioned phenomenon.

The magnetic memory elements R1-R4 as illustrated in FIGS. 1A to 1D are provided with the first and second fixed layers FP1 and FP2, each including a monolayer. In the elements, both the magnetization MFP1 of the first fixed layer FP1 and the magnetization MFP2 of the second fixed layer FP2 orient perpendicularly to the layer surfaces, i.e., the working surfaces, and are anti-parallel to each other. Moreover, the magnetization of the memory layer FF orients also stably in a direction perpendicular to the layer surface. Therefore, the magnetization MFF of the memory layer FF can be parallel or antiparallel to that of the fixed layer.

Furthermore, a case is explained where each of the first fixed layer FP1, second fixed layer FP2 and memory layer FF is provided with a multilayer. That is, respective layers of the first fixed layer FP1, second fixed layer FP2, and memory layer FF may be replaced by a multilayer including two or more ferromagnetic sublayers, and zero or more nonmagnetic sublayers. The structure of the multilayer is called a "synthetic" structure.

Figure 8:
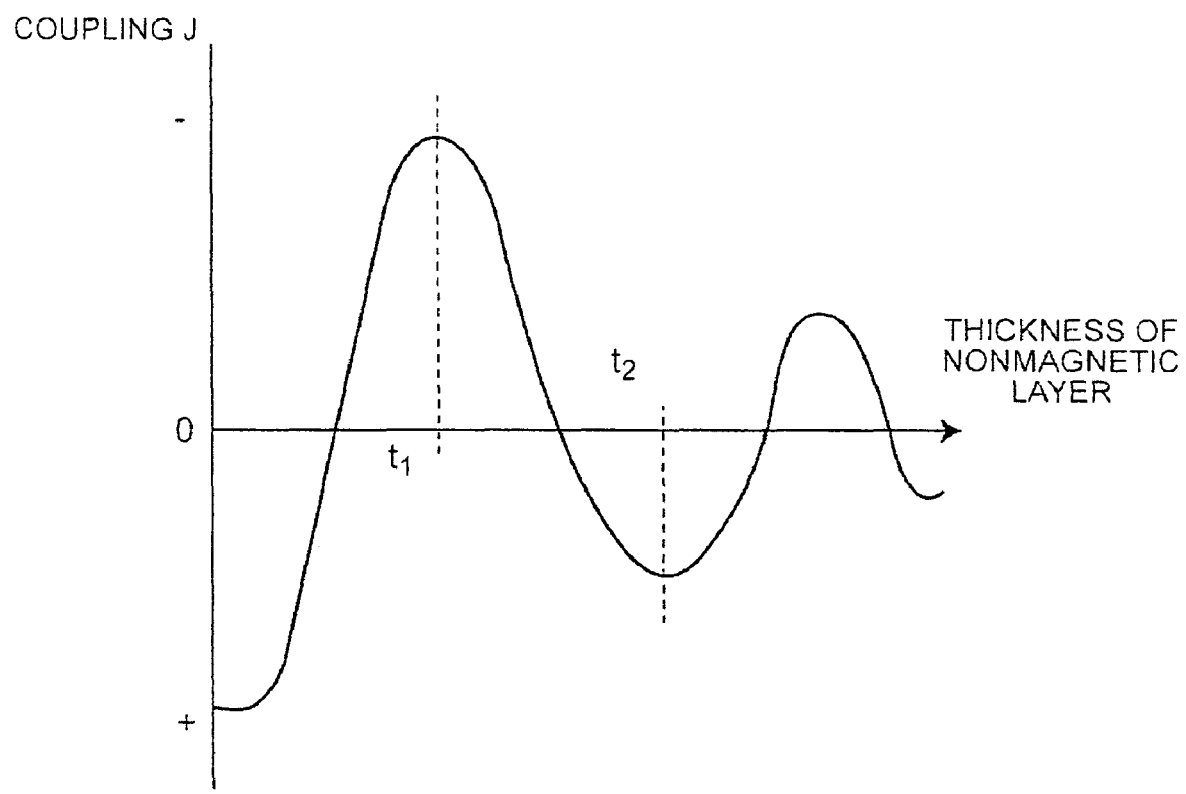
FIG. 8 is a schematic view illustrating exchange coupling between two ferromagnetic layers through a nonmagnetic layer.

FIG. 8 is a schematic view illustrating exchange coupling between two ferromagnetic layers via a nonmagnetic layer.

The horizontal and vertical axes of FIG. 8 represent a thickness of the nonmagnetic layer and exchange coupling of the two magnetic layers, respectively. As shown in FIG. 8, the exchange coupling between the two ferromagnetic layers via the nonmagnetic layer generally oscillates between positive and negative values with respect to the thickness of the nonmagnetic layer. The thickness of the nonmagnetic sublayer sandwiched by the two ferromagnetic sublayers can be adjusted so as to correspond to any one of the positive (or negative) peak positions in FIG. 8. Then the exchange coupling between the two ferromagnetic sublayers can be configured to be ferromagnetic (or antiferromagnetic).

In addition, when the first fixed layer FP1 includes two or more first ferromagnetic sublayers, each magnetization direction of the ferromagnetic sublayers meets the same conditions as in the case where the first fixed layer FP1 is a monolayer. That is, each magnetization direction of the first ferromagnetic sublayers is perpendicular to the layer surface, i.e., the working surface. Magnetization configurations of the first ferromagnetic sublayers constituting the first fixed layer are fixed so as to establish the following relationships. The magnetization direction of the memory layer FF and the magnetization direction of the first ferromagnetic sublayer of the first fixed layer FP1 being nearest to the first intermediate layer S1 are antiparallel to each other whenever the magnetization direction of the memory layer FF and the magnetization direction of the second ferromagnetic sublayer of the second fixed layer FP2 being nearest to the second intermediate layer S2 are parallel to each other, and vice versa. Here, the first and second intermediate layers S1 and S2 are sandwiched between the layer FP1 and the layer FF, and between the layer FP2 and the layer FF, respectively. The stray field generated by the fixed layers is a sum of the stray fields generated by respective ferromagnetic sublayers constituting the fixed layers to be received by the memory layer FF. A stray field generated by each ferromagnetic sublayer, which is received by the memory layer FF, is expressed by the formula 5 adopting the above-mentioned rectangular parallelepiped approximation for the sublayer. In addition, the magnetization direction MFP1 of the first fixed layer FP1 means a magnetization direction of the first ferromagnetic sublayer nearest to the first intermediate layer S1 among the first ferromagnetic sublayers included in the first fixed layer FP1. Here, the value of the stray field generated by a sublayer included in the first fixed layer is taken to be positive when the magnetization of the sublayer has the same direction as that of the first fixed layer, and negative otherwise.

When the second fixed layer FP2 includes two or more second ferromagnetic sublayers, each magnetization direction of the second ferromagnetic sublayers meets the same conditions as in the case where the FP2 layer is a monolayer. And the magnetization direction MFP2 of the second fixed layer FP2 means a magnetization direction of the second ferromagnetic sublayer nearest to the second intermediate layer S2 among the second ferromagnetic sublayers included in the second fixed layer FP2. The stray field generated by a sublayer included in the second fixed layer is taken to be positive when the magnetization of the sublayer has the same direction as that of the second fixed layer, and negative otherwise.

When the memory layer FF includes two or more memory ferromagnetic sublayers, each magnetization direction of the memory ferromagnetic sublayers meets the same conditions as in the case where the memory layer FF is a monolayer. The magnetization direction MFF of the memory layer FF in the explanation of the above-mentioned write-in means a magnetization direction of the memory ferromagnetic sublayer nearest to the first intermediate layer S1 among the memory ferromagnetic sublayers included in the memory layer FF.

The magnetization direction MFF of the memory layer FF in the explanation of the above-mentioned read-out means a magnetization direction of the memory ferromagnetic sublayer nearest to the first intermediate layer S1 among the memory ferromagnetic sublayers included in the memory layer FF.

Magnetization directions of the other ferromagnetic sublayers will be uniquely determined depending on whether the exchange coupling between the adjacent ferromagnetic sublayers is ferromagnetic or antiferromagnetic.

As mentioned above, when each of the first fixed layer FP1, second fixed layer FP2, and memory layer FF includes two or more ferromagnetic sublayers, the formula 10 is expressed by a sum of contributions from respective ferromagnetic sublayers. That is, the formula 10 can be extended to the following formula 11 in the cases including the case where each of the first fixed layer FP1, second fixed layer FP2 and memory layer FF includes two or more ferromagnetic sublayers.

What is necessary for improving the asymmetry by x % or more is just to satisfy the formula 11, assuming that: the first fixed layer FP1 includes N (N: an integer 1 or more) ferromagnetic layers (the first ferromagnetic sublayers); saturation magnetization $M_{1i}$ of an i-th first ferromagnetic layer $FP1_i$ (i-th first ferromagnetic sublayer $SFP1_i$); the volume of the i-th first ferromagnetic layer $FP1_i$ is approximated by a rectangular parallelepiped with a size of $a_{1i} \times b_{1i} \times t_{1i}$; the second fixed layer FP2 includes M (M: an integer 1 or more) ferromagnetic layers (the second ferromagnetic sublayers); saturation magnetization of an j-th second ferromagnetic layer $FP2_j$ (j-th second ferromagnetic sublayer $SFP2_j$) is $M_{2j}$; the volume of the j-th second ferromagnetic layer $FP2_j$ is approximated by a rectangular parallelepiped with a size of $a_{2j} \times b_{2j} \times t_{2j}$; the memory layer FF includes P (P: an integer 1 or more) memory ferromagnetic layers (the memory sublayers); saturation magnetization of a k-th memory ferromagnetic layer $FF_k$ (k-th memory sublayer $SFF_k$) is $M_{Sk}$; an anisotropy field of the k-th memory ferromagnetic layer $FF_k$ (k-th memory sublayer $SFF_k$) is $H_{Kk}$; a distance between the i-th first ferromagnetic layer $FP1_i$ (i-th first ferromagnetic sublayer $SFP1_i$) and the k-th memory ferromagnetic layer $FF_k$ (k-th memory sublayer $SFF_k$) is $d_{1ik}$; a distance between the j-th second ferromagnetic layer $FP2_j$ (j-th second ferromagnetic sublayer $SFP2_j$) and the k-th memory ferromagnetic layer $FF_k$ (k-th memory sublayer $SFF_k$) is $d_{2jk}$.

$$\sum_{k=1}^{P}\sum_{i=1}^{N} H_S\binom{M_{1i}; a_{1i},}{b_{1i}, t_{1i}; d_{1ik}} - \sum_{k=1}^{P}\sum_{j=1}^{M} H_S\binom{M_{2j}; a_{2j},}{b_{2j}, t_{2j}; d_{2jk}} \geq \sum_{k=1}^{P} C(x)(H_{Kk} - 4\pi M_{Sk})$$ [formula 11]

Therefore, what is necessary is just to satisfy the following formula 12 in order to improve the asymmetry by 10%.

$$0.75 \times \sum_{k=1}^{P}\sum_{i=1}^{N} 2\pi M_{1j}\binom{\phi(a_{1i}, b_{1i}, d_{1ik}) -}{\phi(a_{1i}, b_{1i}, t_{1i} + d_{1ik})} - 0.75 \times \sum_{k=1}^{P}\sum_{j=1}^{M} 2\pi M_{2j}\binom{\phi(a_{2j}, b_{2j}, d_{2jk}) -}{\phi(a_{2j}, b_{2j}, t_{2j} + d_{2jk})} \geq 0.052 \times \sum_{k=1}^{P} (H_{Kk} - 4\pi M_{Sk})$$ [formula 12]

Moreover, what is necessary is just to satisfy the following formula 13 in order to improve the asymmetry by 30%.

$$0.75 \times \sum_{k=1}^{P}\sum_{i=1}^{N} 2\pi M_{1j}\binom{\phi(a_{1i}, b_{1i}, d_{1ik}) -}{\phi(a_{1i}, b_{1i}, t_{1i} + d_{1ik})} - 0.75 \times \sum_{k=1}^{P}\sum_{j=1}^{M} 2\pi M_{2j}\binom{\phi(a_{2j}, b_{2j}, d_{2jk}) -}{\phi(a_{2j}, b_{2j}, t_{2j} + d_{2jk})} \geq 0.18 \times \sum_{k=1}^{P} (H_{Kk} - 4\pi M_{Sk})$$ [formula 13]

When all the first fixed layer FP1, second fixed layer FP2 and memory layer FF are formed of a ferromagnetic monolayer, it is applied to the formula 11 that N, M and P equal 1 (i=1; j=1; k=1), corresponding to the formula 10.

In such a case, what is necessary is just to satisfy the following formula 14, in order to improve the asymmetry by 10%.

$$0.75 \times 2\pi M_1(\phi(a_1,b_1,d_1) - \phi(a_1,b_1,t_1+d_1)) - 0.75 \times 2\pi M_2(\phi(a_2,b_2,d_2) - \phi(a_2,b_2,t_2+d_2)) \geq 0.052 \times (H_K - 4\pi M_S)$$ [formula 14]

Moreover, what is necessary is just to satisfy the following formula 15 in order to improve the asymmetry by 30%.

$$0.75 \times 2\pi M_1(\phi(a_1,b_1,d_1) - \phi(a_1,b_1,t_1+d_1)) - 0.75 \times 2\pi M_2(\phi(a_2,b_2,d_2) - \phi(a_2,b_2,t_2+d_2)) \geq 0.18 \times (H_K - 4\pi M_S)$$ [formula 15]

It is preferable that the thickness $d_1$ of the first intermediate layer S1 is smaller than that of the second intermediate layer S2, as requirements are eased to be met by the other parameters. The larger the thickness $d_1$ is, the higher exponentially the resistance of the memory element is. This creates a breakdown risk of insulation because of a high voltage applied on the first intermediate layer S1 at the time of writing to the memory layer FF. Consequently, the thickness $d_1$ is preferably 1 nm or less.

When the first fixed layer FP1 includes two or more first ferromagnetic sublayers $SFP1_i$ and the memory layer FF includes two or more memory ferromagnetic sublayers $SFF_k$, the layer thickness $d_1$ of the first intermediate layer S1 can be regarded as a shortest distance between the first ferromagnetic sublayer $SFP1_i$ and the memory ferromagnetic sublayer $SFF_k$, provided that the first ferromagnetic sublayer $SFP1_i$ and the memory ferromagnetic sublayer $SFF_k$ are nearest to each other among the first ferromagnetic sublayers $SFP1_i$ and the memory ferromagnetic sublayers $SFF_k$.

Employing the synthetic antiferromagnetic coupling structures mentioned above for the first fixed layer FP1, second fixed layer FP2, and memory layer FF allows it to configure various magnetic memory elements.

FIGS. 9A to 9F are cross-sectional views illustrating structures of magnetic memory elements according to the first embodiment of the invention.

Figure 9A:
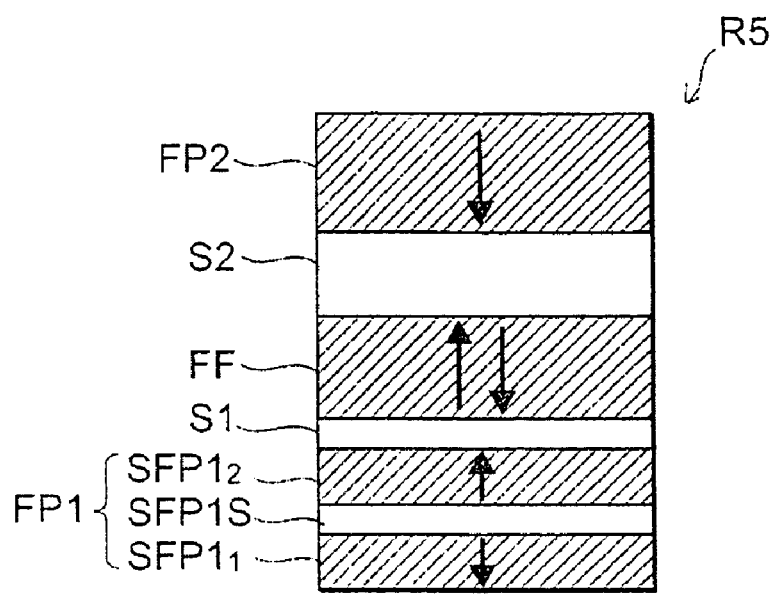
FIGS. 9A to 9F are cross-sectional views illustrating structures of magnetic memory elements according to the first embodiment of the invention.
Figure 9B:
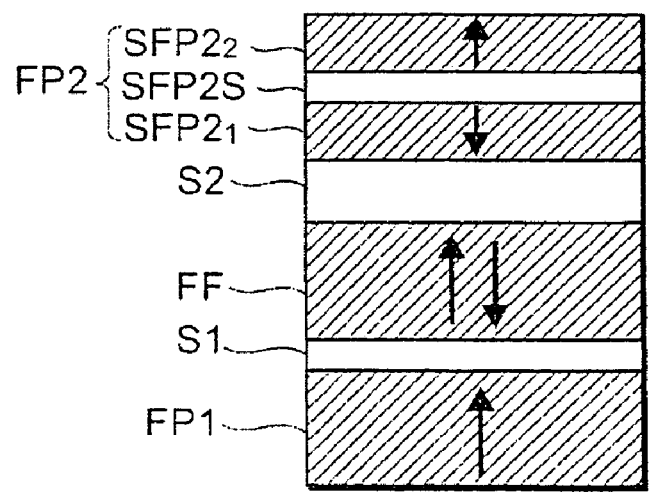
Figure 9C:
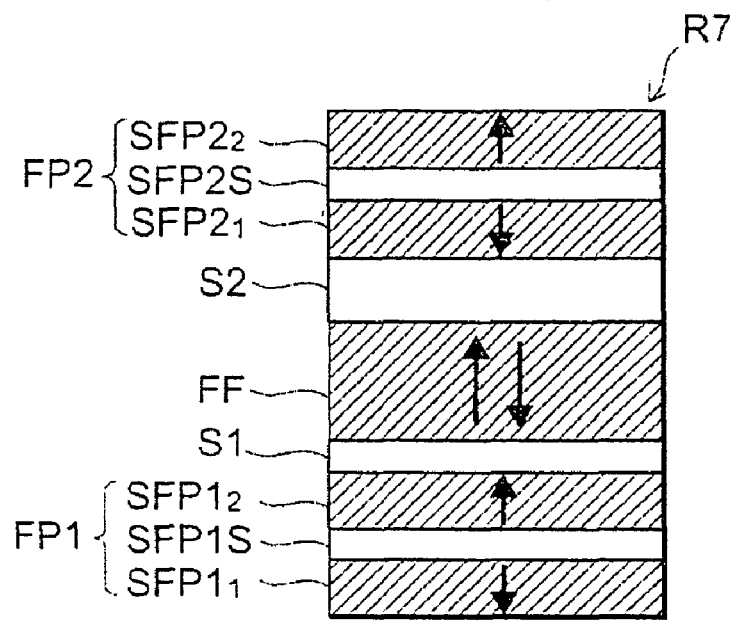

A magnetic memory element R5 is an example illustrated in FIG. 9A that uses a synthetic antiferromagnetic coupling trilayer for the first fixed layer FP1. A magnetic memory element R6 is an example illustrated in FIG. 9B that uses the trilayer for the second fixed layer FP2. A magnetic memory element R7 is an example illustrated in FIG. 9C that uses the trilayer for the first and second fixed layers FP1 and FP2.

Figure 9D:
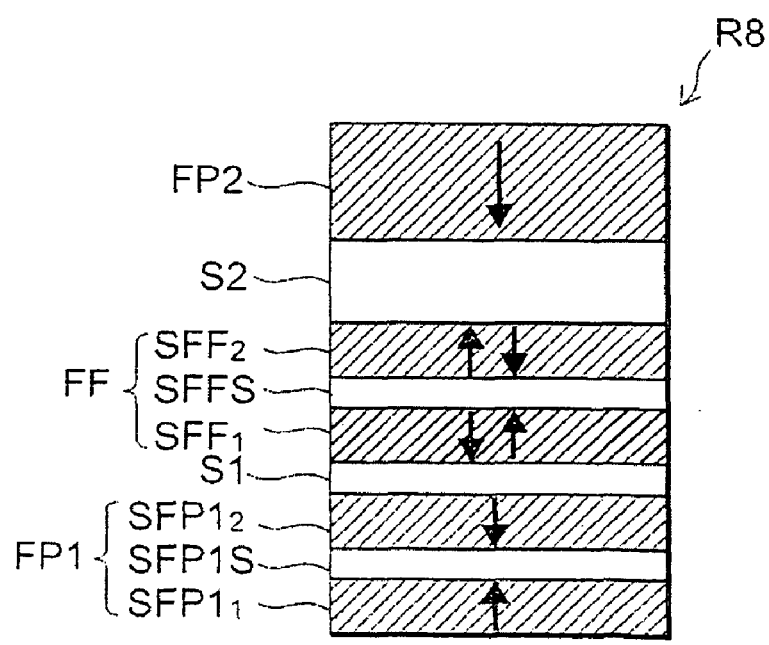
Figure 9E:
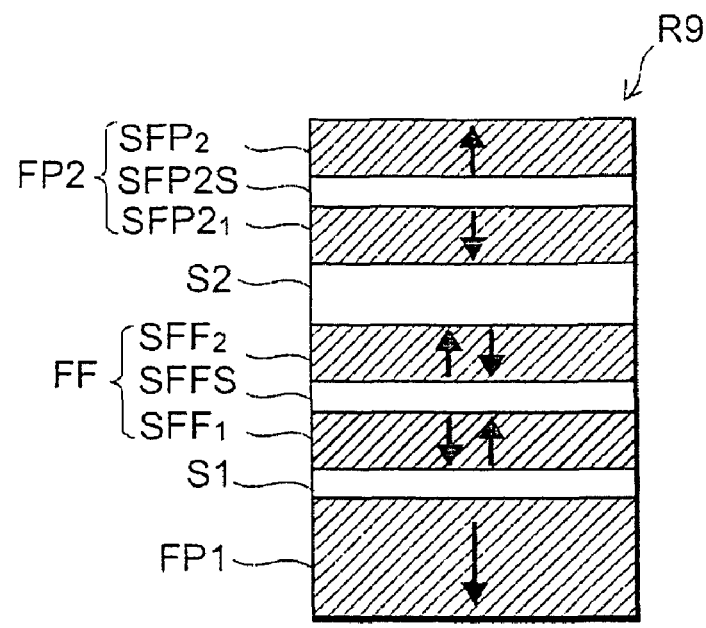
Figure 9F:
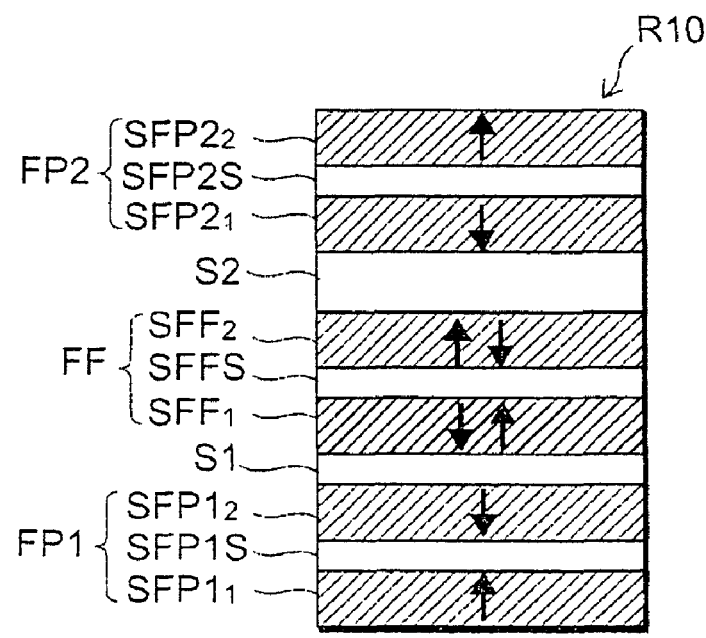

A magnetic memory element R8 is an example illustrated in FIG. 9D that uses the trilayer for the first fixed layer FP1 and the memory layer FF. A magnetic memory element R9 is an example illustrated in FIG. 9E that uses the trilayer for the second fixed layer FP2 and the memory layer FF. A magnetic memory element R10 is an example illustrated in FIG. 9F that uses the trilayer for the first fixed layer FP1, the second fixed layer FP2 and the memory layer FF.

In all the examples described above, magnetization configurations of the ferromagnetic sublayers constituting the first and second fixed layers FP1 and FP2 are fixed so as to satisfy the following relationships. The magnetization direction of the memory sublayer being nearest to the first intermediate layer S1 in the memory layer FF and the magnetization direction of the first ferromagnetic sublayer being nearest to the first intermediate layer S1 in the first fixed layer FP1 are antiparallel to each other whenever the magnetization direction of the memory sublayer being nearest to the first intermediate layer S2 in the memory layer FF and the magnetization direction of the ferromagnetic sublayer being nearest to the first intermediate layer S2 in the second fixed layer FP2 are parallel to each other, and vice versa. Here, the first and second intermediate layers S1 and S2 are sandwiched between by the layer FP1 and the layer FF, and between by the layer FP2 and the layer FF, respectively.

Constituent materials are explained for each layer of the ferromagnetic memory elements according to the embodiment. Various kinds of ferromagnetic materials can be used for the first fixed layer FP1, second fixed layer FP2, and memory layer FF. In the memory elements according to the embodiment, different ferromagnetic materials may be used for each layer of the first fixed layer FP1, second fixed layer FP2, and memory layer FF.

It is possible to use materials, e.g., having a high uniaxial anisotropy constant Ku and exhibiting perpendicular magnetic anisotropy for the first fixed layer FP1, second fixed layer FP2 and memory layer FF. For example, there exist alloys containing one or more elements selected from the group consisting of iron (Fe), cobalt (Co), nickel (Ni), manganese (Mn) and chromium (Cr), and one or more elements selected from the group of platinum (Pt), palladium (Pd), iridium (Ir), ruthenium (Ru) and rhodium (Rh). It is also possible to adjust the uniaxial anisotropy constant $K_u$ also by changing alloy compositions or by heat treatment of ordered alloys.

It is also possible to use materials having hcp structure (hexagonal close-packed structure) and exhibiting perpendicular magnetic anisotropy for the first fixed layer FP1, second fixed layer FP2 and memory layer FF. A typical example thereof is a magnetic material containing metal composed primarily of Co, and other metals having the hcp structure can also be used.

It is also possible to use alloys of rare earth elements and iron-group transition elements exhibiting perpendicular magnetic anisotropy, such as GdFe, GdCo, GdFeCo, TbFe, TbCo, TbFeCo, GdTbFe, GdTbCo, DyFe, DyCo, and DyFeCo.

The thickness is preferably in the range of 0.6 to 100 nm for the first and second fixed layers FP1 and FP2. The thickness of the memory layer is preferably in the range of 0.2 to 20 nm.

Co, CoCr and CoFe can be used for constituent ferromagnetic sublayers of the multilayer, and Pt or Pd can be used for constituent nonmagnetic sublayers of the multilayer when the first fixed layer FP1, second fixed layer FP2 and memory layer FF are a multilayer. A typical example is a structure in which a Co sublayer and a Pt sublayer are laminated one after the other repeatedly, e.g., 3 to 6 times. As another example, an alloy containing one or more elements selected from the group of Fe, Co and Ni, or an alloy containing one or more elements selected from the group of Fe, Co, Ni, Mn and Cr can be used for a sublayer being nearest to the intermediate layer among the ferromagnetic sublayers. Soft magnetic materials include CoNbZr, FeTaC, CoTaZr, FeAlSi, FeB and CoFeB. The use of materials with high spin polarization for the sublayer being nearest to the intermediate layer increases a magnetization reversal efficiency due to the spin transfer, resulting in a preferable effect of such as a low reversal current threshold and a high magnetoresistance ratio to ease read-out. Therefore, a material called a "half metal" with high spin polarization is one of the ideal materials for the sublayer being nearest to the intermediate layer among the ferromagnetic sublayers. Half metals include Heusler alloys, rutile oxides, spinel oxides, perovskite oxides, double perovskite oxides, chromium compounds with zincblende structure, manganese compounds with pyrite structure, and sendust alloys. Specific examples of the half metals include $Co_2MnSi$, $CrO_2$, $Fe_3O_4$, and $La_{1-x}Sr_xMnO_3$, etc.

The first layer FP1, second fixed layer FP2 and memory layer FF consist essentially of the ferromagnetic materials described above, but can be doped or added with nonmagnetic elements such as Ag, Cu, Au, Al, Mg, Si, Bi, Ta, B, C, O, N, Pd, Pt, Zr, Ir, W, Mo, Nb and H to adjust magnetic characteristics and various other material properties including crystallinity and mechanical and chemical characteristics. When the first fixed layer FP1, second fixed layer FP2 and memory layer FF are a multilayer, the constituent nonmagnetic sublayers can be made of Cu, Au, Ag, Ru, Ir, or Os or alloys containing one or more thereof.

The antiferromagnetic layers AF1 and AF2 provided to the first and second fixed layers FP1 and FP2 are preferably made of Fe—Mn, Pt—Mn, Pt—Cr—Mn, Ni—Mn, Pd—Mn, Pd—Pt—Mn, Ir—Mn, Pt—Ir—Mn, NiO, $Fe_2O_3$, or magnetic semiconductors.

When the second intermediate layer S2 is made of non-magnetic metals, the layer S2 can be made "essentially" of any one of Au, Cu, Cr, Zn, Ga, Nb, Mo, Ru, Pd, Ag, Hf, Ta, W, Pt, and Bi, or alloys containing one or more thereof, but may contain impurities. The thickness of the second intermediate layer S2 made of such a nonmagnetic metal is preferably in the range of 0.2 to 20 nm.

In order to increase the magnetoresistance effect of the magnetic memory element of the embodiment, it is effective to make the first intermediate layer S1 function as a tunnel barrier. In this case, the first intermediate layer S1 can be made "essentially" of materials such as $Al_2O_3$, $SiO_2$, MgO, AlN, $Bi_2O_3$, $MgF_2$, $CaF_2$, $SrTiO_2$, $AlLaO_3$, Al—N—O, Si—N—O, or nonmagnetic semiconductors (ZnO, InMn, GaN, GaAs, $TiO_2$, Zn, Te, or any one thereof doped with transition metals). These compounds do not need to have exactly stoichiometric compositions, but may have excessive or deficient oxygen, nitrogen, or fluorine. The thickness of the intermediate layer S2 made of such insulators is preferably in the range of 0.2 to 1 nm.

When the first intermediate layer S1 is an insulating layer, it may include pinholes PH running through the total thickness. In this case, the pinholes PH are filled with the material of at least one of the first fixed layer FP1 and the memory layer FF located on both sides of the layer S1. When the first fixed layer FP1 is connected with the memory layer FF through the pinholes PH, the "BMR effect (ballistic magnetoresistance effect)" due to the so-called "magnetic point contact" is developed. This can result in an extremely great magnetoresistance effect to increase a margin of read-out. A preferable aperture diameter of the pinholes PH is generally 20 nm or less. The pinholes PH can be shaped like a circular cone, circular cylinder, sphere, polygonal cone, polygonal cylinder, or various other shapes. The number of pinholes PH may be one or more. That is, the first intermediate layer S1 is made essentially of insulators, but may include metallic constituents via the pinholes within the layer S1 itself.

A manufacturing method of the magnetic memory element according to the embodiment is explained.

Figure 10:
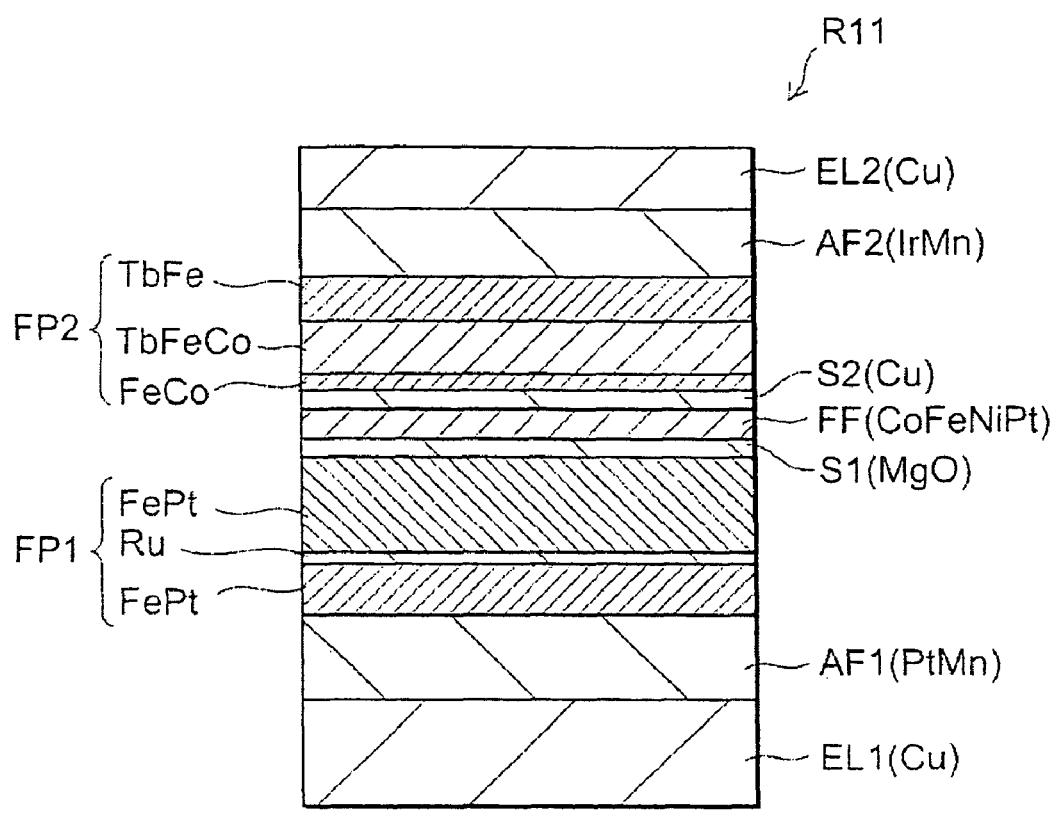
FIG. 10 is a cross-sectional view illustrating a structure of a magnetic memory element according to the first embodiment of the invention.

FIG. 10 is a cross-sectional view illustrating a structure of a magnetic memory element according to the first embodiment of the invention.

As shown in FIG. 10, the material and thickness of each layer constituting a magnetic memory element R11 according to the first embodiment are as follows:

R11 is provided with a multilayer including a first electrode EL1 (Cu)/an antiferromagnetic layer AF1 (PtMn: 20 nm)/the first fixed layer FP1 (FePt: 12 nm/Ru: 1 nm/FePt: 25 nm)/the first intermediate layer S1 (MgO: 0.8 nm)/the memory layer FF (CoFeNiPt: 3 nm)/the second intermediate layer S2 (Cu: 6 nm)/the second fixed layer FP2 (FeCo: 0.5 nm/TbFeCo: 20 nm/TbFe: 10 nm)/an antiferromagnetic layer AF2 (IrMn: 18 nm)/a second electrode EL2 (Cu). Here, lengths in brackets are layer thicknesses of the respective layers.

The magnetic memory element R11 with the above-mentioned structure and material can be manufactured according to the following processes. The first electrode EL1 is provided on a wafer, and a multilayer with the antiferromagnetic layer AF1, first fixed layer FP1, first intermediate layer S1, memory layer FF, second intermediate layer S2, second fixed layer FP2, and antiferromagnetic layer AF2 laminated continuously is provided using an ultrahigh-vacuum sputtering apparatus, and then a protective film is finally provided on the multilayer. The whole wafer with the multilayer is annealed in a vacuum furnace in a magnetic field at 270° C. for 10 hours to provide the first and second fixed layers FP1 and FP2 with unidirectional anisotropy. Electron beam resist is coated on the protective film, and is EB (electron beam) exposed to form a mask adapted to the shape of the magnetic memory element. Then a region of the wafer not covered with the mask is etched by ion milling. After the etching, the mask is removed, and $SiO_2$ film is successively deposited between cells provided on the wafer by ultrahigh vacuum sputtering. Then the surface of the wafer was smoothed by ion milling to expose the surface of the protective film. The second electrode EL2 is provided on the surface of this protective film. This results in the magnetic memory element R11. The magnetic memory element R11 has the same magnetization configuration as that of the magnetic memory element R5 illustrated in FIG. 9A. However, the magnetic memory element R11 is an example in which the second fixed layer FP2 is provided with a trilayer of FeCo/TbFeCo/TbFe.

In addition, the magnetization directions of the two ferromagnetic sublayers constituting the first fixed layer FP1 are anti-parallel in the magnetic memory element R11, and as shown in FIG. 9A, the magnetization directions of the outermost sublayer (bottom sublayer) in the first fixed layer and the second fixed layer are parallel. This allows it to provide the element R11 with unidirectional anisotropy by single annealing with a magnetic field applied, bringing about a manufacturing merit.

Examples are explained below.

FIRST EXAMPLE

A magnetic memory element R110 of the first example of the invention is explained.

Figure 11:
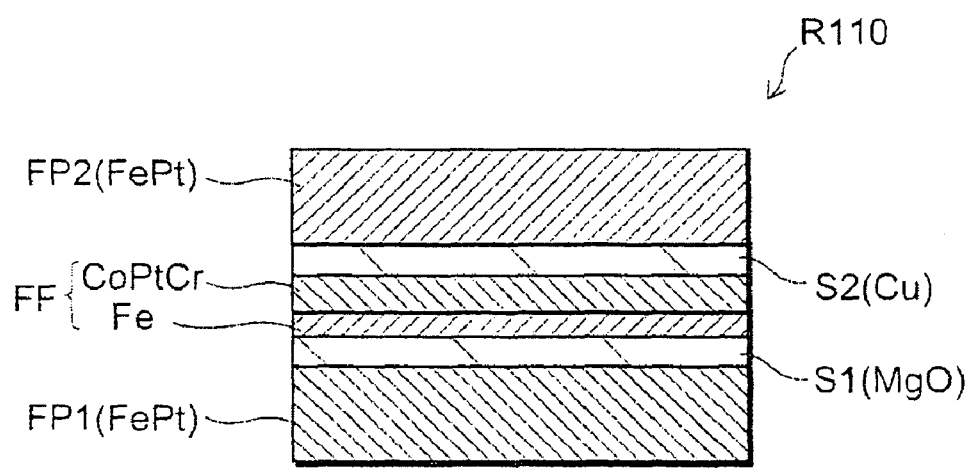
FIG. 11 is a cross-sectional view illustrating a structure of a magnetic memory element according to the first example of the invention.

A planer size of the magnetic memory element R110 is 50 nm×60 nm. FIG. 11 is a cross-sectional view illustrating the structure of the magnetic memory element according to the first example of the invention.

As shown in FIG. 11, the magnetic memory element R110 of the first example has a multilayer including the first fixed layer FP1 (FePt: $t_1$ nm)/first intermediate layer S1 (MgO: 0.9 nm)/memory layer FF (Fe: 0.2 nm/CoPtCr: 2 nm)/second intermediate layer S2 (Cu: $d_2$ nm)/second fixed layer FP2 (FePt: 20 nm). The numerals denote thicknesses of the respective layers.

In the above, the thickness $t_1$ of the first fixed layer FP1 and the thickness $d_2$ of the second intermediate layer S2 are variable. The stray field $\Delta H_s$ was simulated for the magnetic memory element R110 of the first example with $d_2$=6 nm constant and with the thickness $t_1$ of the first fixed layer variable.

Figure 12:
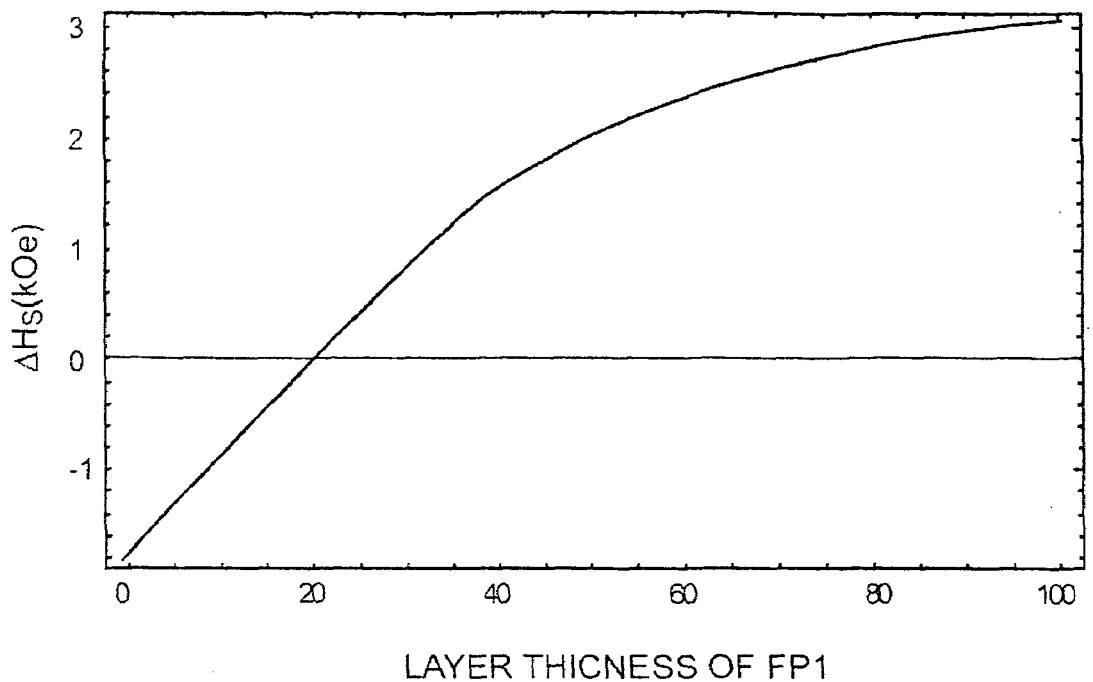
FIG. 12 is a graph illustrating a simulation of a stray field of a magnetic memory element according to the first example of the invention.

FIG. 12 is a graph illustrating a simulation of the stray field of the magnetic memory element according to the first example of the invention.

The horizontal axis represents the layer thickness $t_1$ of the first fixed layer FP1, and the vertical axis represents the stray field $\Delta H_s$ in FIG. 12. Here, the saturation magnetization Ms (FePt) of FePt used for the first fixed layer FP1 was set to 1140 Oe in the simulation.

In FIG. 12, a region of $t_1$>20 nm corresponds to the example.

In the region of $t_1$>20 nm, $\Delta H_s$>0 is satisfied, meaning that the stray field generated by the first fixed layer FP1 reaches the memory layer FF more greatly than that by the second fixed layer FP2.

Setting the thickness of the first fixed layer, e.g., to 50 nm results in $\Delta H_s$=2 kOe. The anisotropy field $H_K$ and Ms of the memory layer FF are 13.4 kOe and 300 emu/cm$^3$, respectively, yielding a relationship of $H_K$−4πMs=9.7 kOe. Taking the relationship into consideration, the parameter γ is obtained to be 0.66 from the formula 9. In this case, the asymmetry of the reversal current can be improved by 34%, eliminating a break-down risk of the element. In addition to these advantages, it is further advantageous to use a single power source for a magnetic memory apparatus provided with the present magnetic memory elements to be described later.

Setting the thickness of the first fixed layer FP1 to 25 nm results in the stray field $\Delta H_s$=0.45 kOe, yielding the parameter γ=0.91. The asymmetry of the reversal current can be improved by 9%.

Next, the stray field $\Delta H_s$ was simulated with the thickness $t_1$ of the first fixed layer FP1 set to 30 nm and the thickness $d_2$ of the second intermediate layer S2 variable.

Figure 13:
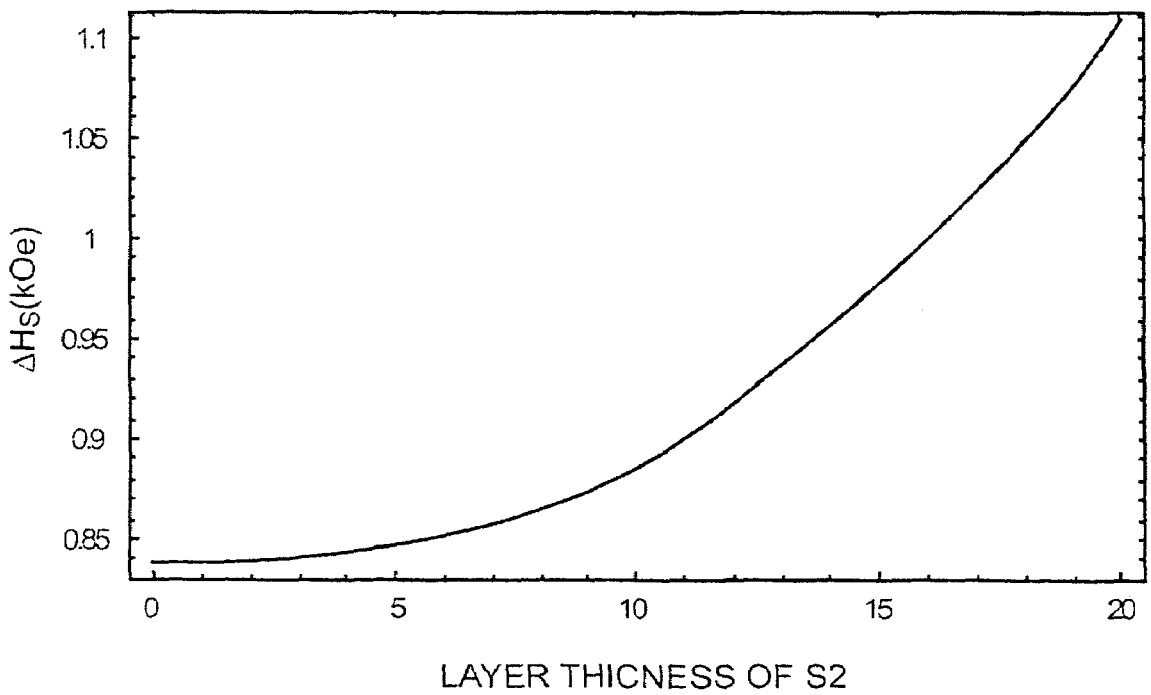
FIG. 13 is a graph illustrating the simulation of a stray field of a magnetic memory element according to the first example of the invention.
Figure 14A:
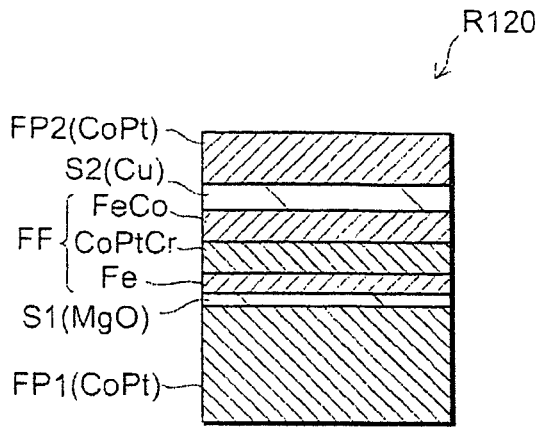
FIG. 14 is a cross-sectional view illustrating a structure of magnetic memory elements according to a second to the sixth examples of the invention.
Figure 14B:
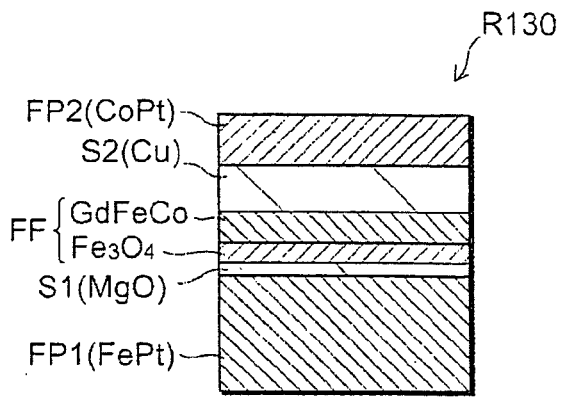
Figure 14C:
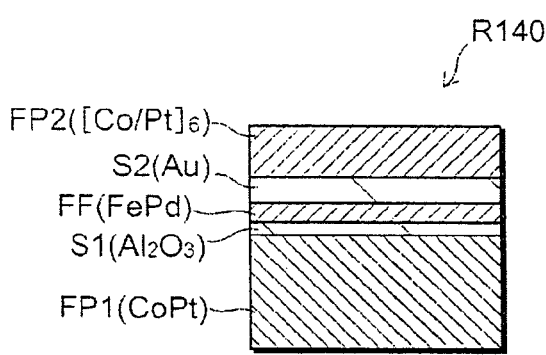
Figure 14D:
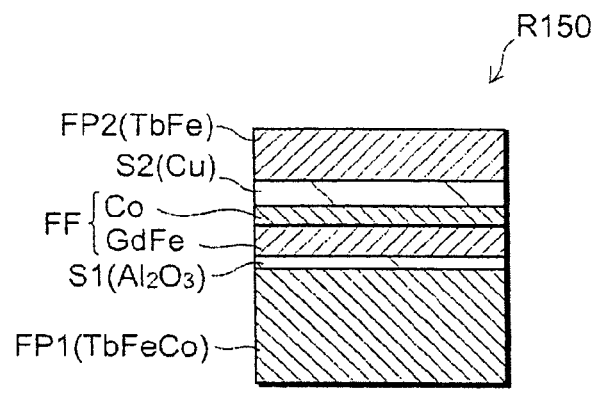
Figure 14E:
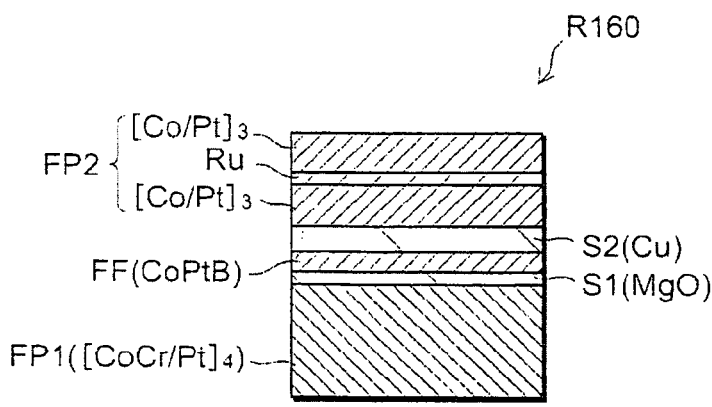

FIG. 13 is a graph illustrating the simulation of the stray field of the magnetic memory element according to the first example of the invention.

The horizontal axis represents the thickness $d_2$ of the second intermediate layer S2, and the vertical axis represents the stray field $\Delta H_s$ in FIG. 13.

The entire region of the thickness $d_2$ of the second intermediate layer S2 corresponds to this example.

That is, as shown in FIG. 13, the stray field $\Delta H_s$ is positive, independently of the thickness of the second intermediate layer S2, meaning that the first fixed layer FP1 influences the memory layer FF more greatly than the second fixed layer FP2 via the stray fields generated by the respective two layers FP1 and FP2.

Setting the thickness $d_2$ of the second intermediate layer S2 to 3 nm results in $\Delta H_s=0.84$ kOe and $\gamma=0.84$. In this case, the asymmetry of the reversal current can be improved by 16%.

The same simulation of the magnetic memory element R110 with a planer size of 25 nm×30 nm results in $\gamma=0.82$ when $(t_1, d_2)=(25\text{ m}, 6\text{ nm})$. The parameter $\gamma$ is obtained to be 0.82 when $(t_1, d_2)=(30\text{ nm}, 3\text{ nm})$. The value of $\gamma$ in these cases tends to be comparable to or less than that of the case where the planer size is 50 nm×60 nm.

That is, as shown in FIG. 4, when the thickness t of the fixed layer is below or comparable to the planer size $(a\times b)^{1/2}$ and one of the intermediate layers has a thickness not less than 10% of $(a\times b)^{1/2}$ in the magnetic memory element R110, downsizing the memory element improves the asymmetry remarkably.

OTHER EXAMPLE

A magnetic memory element according to other examples of the invention is explained.

FIGS. 14A to 14E are cross-sectional views illustrating a structure of the magnetic memory elements according to the second to the sixth examples of the invention.

As shown in FIG. 14A to 14E, magnetic memory elements R120 to R160 according to the second to the sixth examples of the invention have the following structures. That is, each layer containing the following material is laminated, and the numerals denote a thickness of each layer. $[X/Y]_n$ means that respective n layers of the substance X and the substance Y are laminated alternately.

SECOND EXAMPLE

The element R120 includes the first fixed layer FP1 (CoPt: 40 nm)/first intermediate layer S1 (MgO: 0.9 nm)/memory layer FF (Fe: 0.2 nm/CoPtCr: 2.5 nm/FeCo: 0.3 nm)/second intermediate layer S2 (Cu: 5 nm)/second fixed layer FP2 (CoPt: 20 nm).

THIRD EXAMPLE

The element R130 includes the first fixed layer FP1 (FePt: 25 nm)/first intermediate layer S1 (MgO: 0.8 nm)/memory layer FF ($Fe_3O_4$: 0.4 nm/GdFeCo: 5 nm)/second intermediate layer S2 (Cu: 6 nm)/second fixed layer FP2 (CoPt: 30 nm).

FOURTH EXAMPLE

The element R140 includes the first fixed layer FP1 (CoPt: 25 nm)/first intermediate layer S1 ($Al_2O_3$: 1.0 nm)/memory layer FF (FePd: 2.3 nm)/second intermediate layer S2 (Au: 3 nm)/the second fixed layer FP2 ($[Co: 0.4\text{ nm}/Pt: 1.0\text{ nm}]_6$).

FIFTH EXAMPLE

The element R150 includes the first fixed layer FP1 (TbFeCo: 40 nm)/first intermediate layer S1 ($Al_2O_3$:0.9 nm)/ memory layer FF (GdFe: 2.2 nm/Co: 0.2 nm)/second intermediate layer S2 (Cu: 4 nm)/second fixed layer FP2 (TbFe: 35 nm).

SIXTH EXAMPLE

The element R160 includes the first fixed layer FP1 ($[CoCr: 1.0\text{ nm}/Pt: 1.8\text{ nm}]_4$/the first intermediate layer S1 (MgO: 1.0 nm)/memory layer FF (CoPtB: 3.0 nm)/second intermediate layer S2 (Cu: 8 nm)/second fixed layer FP2 ($[Co: 0.9\text{ nm}/Pt: 2.0\text{ nm}]_3$/Ru: 0.8 nm/$[Co: 0.9\text{ nm}/Pt: 2.0\text{ nm}]_3$).

All the magnetic memory elements R110 to R160 of the example 1 to the example 6 explained above are provided with magnetization directions MFP1 and MFP2 of the first and second fixed layers FP1 and FP2 perpendicular to the layer surface (the working surface). In all the examples, magnetization configurations of the ferromagnetic sublayers constituting the first, second fixed layers FP1, FP2 and the memory layer FF are fixed so as to establish the following relationships. The magnetization direction of the memory sublayer being nearest to the first intermediate layer S1 in the memory layer FF and the magnetization direction of the ferromagnetic sublayer in the first fixed layer FP1 are antiparallel to each other whenever the magnetization direction of the memory sublayer being nearest to the second intermediate layer S2 in the memory layer FF and the magnetization direction of the ferromagnetic sublayer of the second fixed layer FP2 are parallel to each other, and vice versa. Here, the first and second intermediate layers S1 and S2 are sandwiched between the layer FP1 and the layer FF, and between the layer FP2 and the layer FF, respectively. The first fixed layer FP1 influences the memory layer FF more greatly than the second fixed layer FP2 via the stray fields generated by the respective two layers FP1 and FP2. In the sixth example particularly, the magnetization directions of the ferromagnetic sublayers constituting the second fixed layer FP2 are anti-parallel to each other. Such a magnetization configuration is suitable to control the stray fields from the second fixed layer FP2. Thereby, the asymmetry of the reversal current is canceled. Hence, a magnetic memory element capable of reducing a break-down risk of the element may be realized, being suitable for high integration. Moreover, a low-cost magnetic memory apparatus is offered with high reliability.

Second Embodiment

A magnetic memory apparatus of a second embodiment of the invention is explained.

Many magnetic memory elements of this embodiment explained above can be arrayed to form the magnetic memory apparatus.

Figure 15:
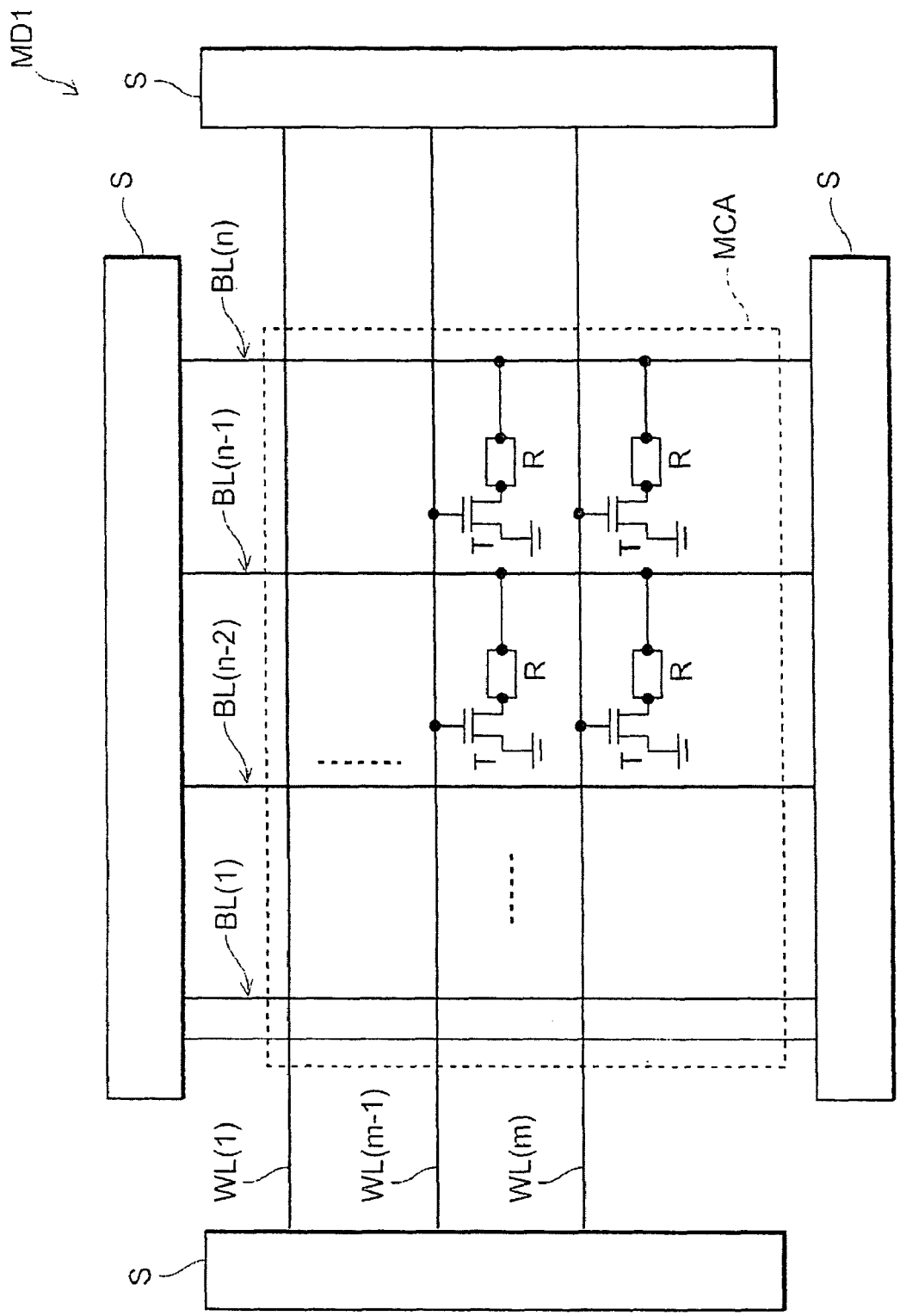
FIG. 15 is a schematic circuit diagram illustrating a configuration of a magnetic memory apparatus according to the second embodiment of the invention.

FIG. 15 is a schematic circuit diagram illustrating a configuration of the magnetic memory apparatus according to the second embodiment of the invention.

In the magnetic memory apparatus MD1 of the second embodiment as shown in FIG. 15, a plurality of interconnections WL are arranged in parallel with each other to be called word lines, and a plurality of interconnections BL, of which directions are in a direction perpendicular to the word lines, are arranged in parallel with each other to be called bit lines. A plurality of memory cells provided with switching elements T, such as a transistor, and magnetic memory elements are arranged in a matrix, and a word line and bit line are connected to each memory cell. A magnetic memory element R of this embodiment is used as the magnetic memory element described above.

Peripheral circuitries S are provided with a decoder to select each interconnection and read-out circuitry on the periphery of a memory cell array MCA, and are connected with each interconnection.

Figure 16:
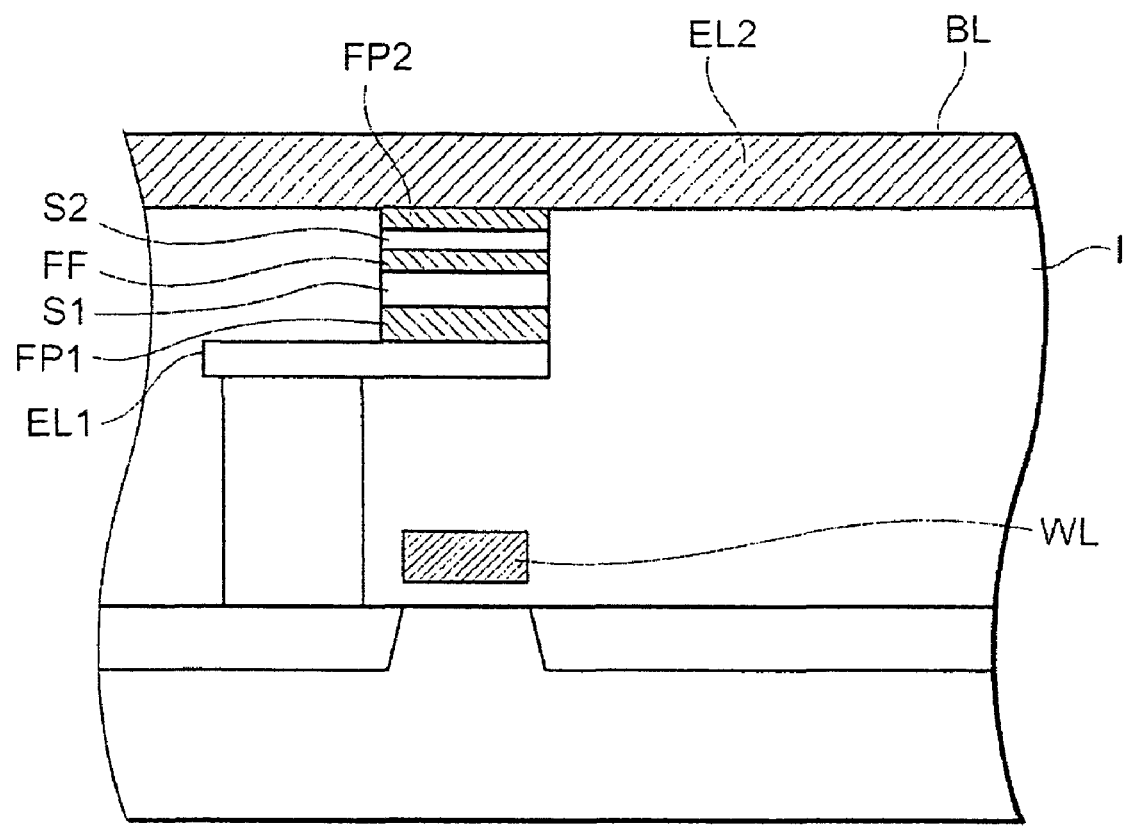
FIG. 16 is a schematic cross-sectional view illustrating a connection path structure of a memory cell of the magnetic memory apparatus according to the second embodiment of the invention, showing a cross-sectional structure of the word and bit lines connected to the memory cell.

FIG. 16 is a cross-sectional view schematically illustrating a connection path structure of the memory cell of the magnetic memory apparatus according to the second embodiment of the invention, showing a cross-sectional structure of the word and bit lines connected to the memory cell. The memory cells are insulated electrically with each other by providing an insulating film I.

Writing to the memory layer FF of the memory element R is available by selecting the word line WL with an address corresponding to an external signal for the address to select the transistor to be turned on. Selecting the bit line BL to pass an electric current $I_w$ through the memory element R completes the writing. Conditions required for the direction and the value of $I_w$ have been described as above.

Data readout from the memory layer FF of the magnetic memory element R is done by selecting the word line WL with an address corresponding to an external signal of the address to select the transistor to be turned on. Selecting the bit line BL to pass an electric current $I_r$ through the memory element R completes the data readout. The direction of $I_r$ may be positive or negative. When the direction of $I_r$ is positive (negative), the absolute value of $I_r$ is supposed to be smaller than that of the writing current $I_w$ of which direction is positive (negative).

According to the embodiment of the invention, write-in and read-out can be done efficiently for two or more magnetic memory elements R arranged in an array. It is also possible to cancel the asymmetry of reversal currents, providing the memory elements capable of reducing a break-down risk of the elements and being suitable for high integration. Thereby, the highly reliable and low-cost magnetic memory apparatus is provided using the memory elements.

Third Embodiment

A magnetic memory apparatus is explained according to a third embodiment of the invention.

Figure 17:
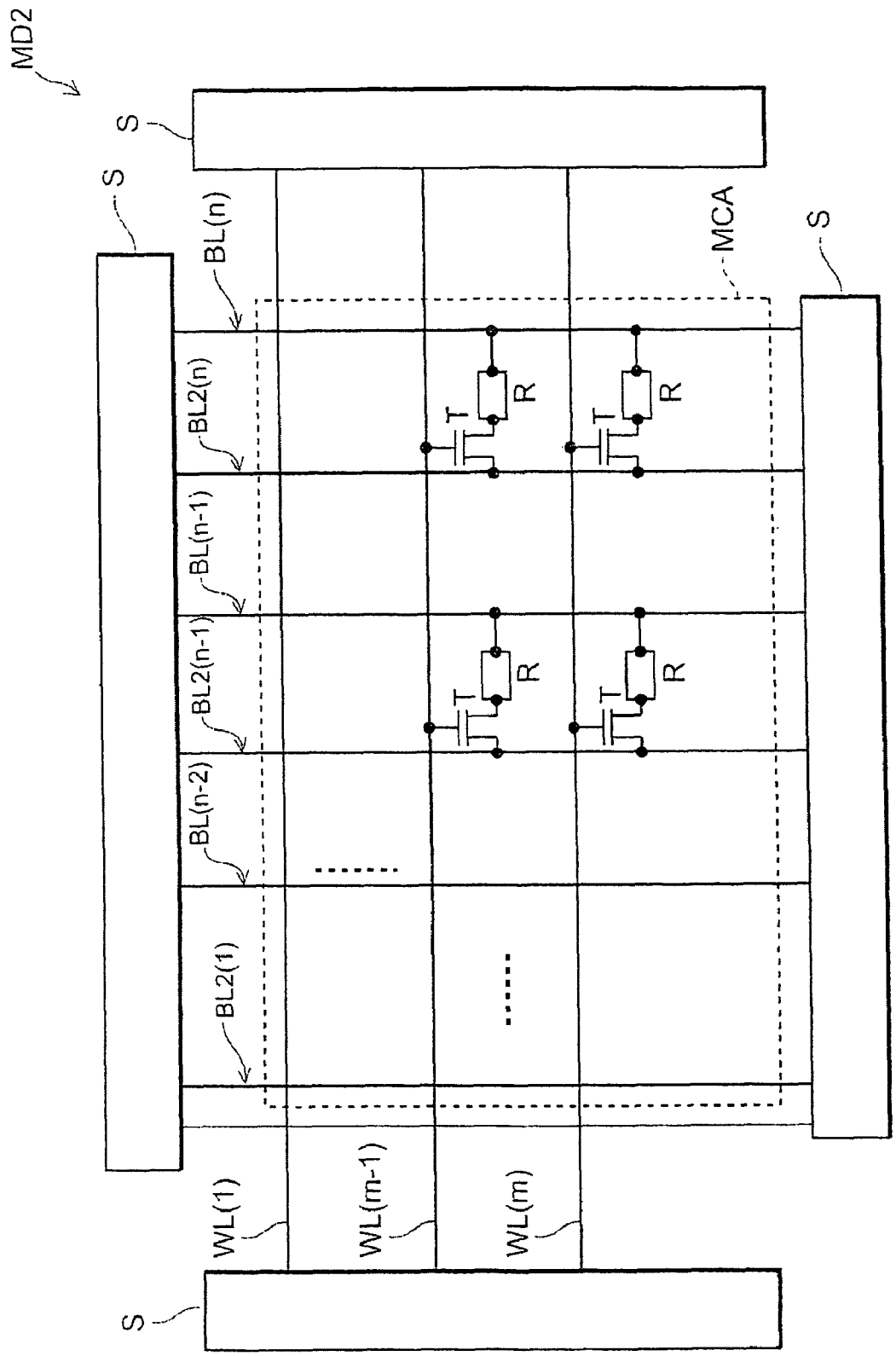
FIG. 17 is a schematic circuitry diagram illustrating a constitution of a magnetic memory apparatus according to a third embodiment of the invention.

FIG. 17 is a circuitry diagram schematically illustrating a configuration of the magnetic memory apparatus according to the third embodiment of the invention.

Each memory cell in the magnetic memory apparatus MD1 is provided additionally with a second bit line BL2 to form the magnetic memory apparatus MD2 according to the third embodiment of the invention as shown in FIG. 17.

A current is required to be passed in a direction according to a data bit through the magnetic memory element R of the embodiment. In the magnetic memory apparatus MD1 illustrated in FIG. 15, the magnetic memory element R is connected to the bit line BL and to one terminal of the switching element T in series, and the other terminal of the switching element is grounded (or connected to a power supply terminal). For this reason, the magnetic memory apparatus MD1 is provided with two different potentials given to the terminals of the bit lines BL or with a unit for passing a current in positive/negative directions. The two bit lines BL and BL2 are connected to each memory cell in the magnetic memory apparatus MD2 illustrated in FIG. 17. Thereby, writing can be done by passing a current between BL and BL2 as follows. What is necessary is to prepare just one power supply, as it is possible to change the current direction by connecting one of BL and BL2 to a power supply and grounding the other. Since the asymmetry of the reversal currents is particularly canceled in the magnetic memory element R of the invention, circuit architecture of the magnetic memory apparatus MD2 illustrated in FIG. 17 can be employed to give rise to a large merit. According to the embodiment of the invention, write-in and read-out can be done efficiently for two or more magnetic memory elements R arranged in an array. It is also possible to cancel the asymmetry of the reversal currents, providing the memory elements capable of reducing a break-down risk of the elements and suitable for high integration. Thereby, the highly reliable and low-cost magnetic memory apparatus is provided by employing the memory elements.

The embodiments of the invention have been described with reference to the examples. However, the invention is not limited to these examples. Any variations in the specific dimensions and material of each component constituting the magnetic memory element and in the shape and material of the electrode, passivation, and insulation structures are encompassed within the scope of the invention as long as those skilled in the art can appropriately select them from known ones to similarly practice the invention and to achieve similar effects.

Each of the fixed layers, memory layers and intermediate layers do not necessarily have the same shape or size, but may have different shapes and sizes to be designed.

However, it is preferable from a view point of a manufacturing process to make a planer shape of the memory layer square, rectangular, polygonal (for example, hexagon), circular, ellipsoidal, lozenged or of parallelogram with an aspect ratio of 1:1 to 1:4.

It is also possible to turn over the structures, illustrated in FIG. 1, FIG. 9, FIG. 10, FIG. 11, and FIG. 14, up and down.

Constituents such as antiferromagnetic layers, intermediate layers or insulating layers may include a monolayer or a multilayer of two or more layers in the magnetic memory element.

All magnetic recording elements and magnetic recording apparatuses which those skilled in the art can implement by modifying appropriately based on the magnetic recording elements and magnetic recording apparatuses described above are included in the present invention as long as they belong to the scope of the present invention.

Additional alterations and modifications will readily occur to those skilled in the art. Therefore, it is intended that the specification and examples may be considered as exemplary only and the invention in its broader aspects is not limited to the specific details and representative embodiments shown and described herein.

Variations from "exactly perpendicular" caused in a manufacturing process are supposed to be included in "perpendicular" throughout the description of the invention. The words, "parallel" or "anti-parallel", means neither "exactly parallel" nor "exactly anti-parallel", but "substantially parallel" or "substantially anti-parallel" throughout the description of the invention.

What is claimed is:

1. A magnetic memory element, comprising:
    a multilayer including:
        a working surface;
        a first fixed layer including a first ferromagnetic material and having a first magnetization direction fixed substantially perpendicular to the working surface;
        a second fixed layer including a second ferromagnetic material and having a second magnetization direction fixed substantially in a direction opposite to the first magnetization direction;
        a memory layer disposed between the first fixed layer and the second fixed layer, the memory layer including a third ferromagnetic material and having a magnetization direction that is variable;

a first intermediate layer disposed between the first fixed layer and the memory layer, the first intermediate layer made essentially of one or more nonmagnetic materials, the nonmagnetic materials including one or both of insulators and semiconductors; and a second intermediate layer disposed between the second fixed layer and the memory layer, the second intermediate layer being nonmagnetic, wherein the magnetization direction of a portion of the memory layer being nearest to the first intermediate layer and the magnetization direction of the first fixed layer are anti-parallel to each other whenever the magnetization direction of a portion of the memory layer being nearest to the second fixed layer and the magnetization direction of the second fixed layer are parallel to each other, and vice versa;

wherein the memory layer receives a larger perpendicular component of a stray field from the first fixed layer than from the second fixed layer;

wherein a current is configured to be passed bi-directionally between the first fixed layer and the second fixed layer;

wherein the current is passed in a first direction over a first threshold to make a magnetization direction of the memory layer in the first direction;

wherein the current is passed in a second direction over a second threshold to make the magnetization direction of the memory layer in the direction opposite to the first direction;

wherein a current is passed between the first fixed layer and the second fixed layer to detect the magnetization direction of the memory layer;

wherein an electric conductivity of a nonmagnetic material to constitute the first intermediate layer is lower than an electric conductivity of a nonmagnetic material to constitute the second intermediate layer;

wherein a thickness of the first intermediate layer is 1 nm or less;

wherein the first fixed layer includes N first ferromagnetic sublayers (N is an integer of 1 or more);

wherein the second fixed layer includes M second ferromagnetic sublayers (M is an integer of 1 or more);

wherein the memory layer includes P memory ferromagnetic sublayers (P is an integer of 1 or more); and wherein the mathematical formula 2 including the function $\phi(a, b, d)$ defined by the mathematical formula 1 is satisfied by $a_{1i}, b_{1i}, t_{1i}, a_{2j}, b_{2j}, t_{2j}, d_{1ik}, d_{2jk}, M_{1i}, M_{2j}, M_{sk}$ and $H_{Kk}$ when an i-th first ferromagnetic sublayer of the N first ferromagnetic sublayers is approximated by a i-th first rectangular parallelepiped;

a j-th second ferromagnetic sublayer of the M second ferromagnetic sublayers is approximated by a j-th second rectangular parallelepiped;

$a_{1i}, b_{1i}$ and $t_{1i}$ represent a height, a width and a thickness of the i-th first rectangular parallelepiped, respectively;

$M_{1i}$ represents saturation magnetization of the i-th first ferromagnetic sublayer;

$a_{2j}, b_{2j}$ and $t_{2j}$ represent a height, a width and a thickness of the j-th second rectangular parallelepiped, respectively;

$M_{2j}$ represents saturation magnetization of the j-th second ferromagnetic sublayer;

$M_{sk}$ and $H_{Kk}$ represent saturation magnetization and an anisotropy field of a k-th memory ferromagnetic layer of the P memory ferromagnetic sublayers, respectively;

$d_{1ik}$ represents a distance between the i-th first ferromagnetic sublayer and the k-th memory ferromagnetic sublayer;

$d_{2jk}$ represents a distance between the j-th second ferromagnetic sublayer and the k-th memory ferromagnetic sublayer, $$\phi(a, b, d) = \frac{2}{\pi} \times \arctan\left(\frac{ab}{2d\sqrt{a^2 + b^2 + 4d^2}}\right) \quad \text{[formula 1]}$$

$$0.75 \times \sum_{k=1}^{P} \sum_{i=1}^{N} 2\pi M_{1i} \left( \begin{array}{c} \phi(a_{1i}, b_{1i}, d_{1ik}) - \\ \phi(a_{1i}, b_{1i}, t_{1i} + d_{1ik}) \end{array} \right) - \quad \text{[formula 2]}$$

$$0.75 \times \sum_{k=1}^{P} \sum_{j=1}^{M} 2\pi M_{2j} \left( \begin{array}{c} \phi(a_{2j}, b_{2j}, d_{2jk}) - \\ \phi(a_{2j}, b_{2j}, t_{2j} + d_{2jk}) \end{array} \right) \geq$$

$$0.052 \times \sum_{k=1}^{P} (H_{Kk} - 4\pi M_{Sk}).$$

2. A magnetic memory apparatus comprising a plurality of word lines, a plurality of bit lines and a plurality of the magnetic memory elements according to claim 1, wherein one of the magnetic memory elements is selected by selecting one of the word lines and one of the bit lines to pass a current between the first fixed layer and the second fixed layer of the selected magnetic memory element, the current allowing detection of a magnetoresistance effect between the memory layer and the first fixed layer.

3. A magnetic memory element, comprising:

a multilayer including:

a working surface;

a first fixed layer including a first ferromagnetic material and having a first magnetization direction fixed substantially perpendicular to the working surface;

a second fixed layer including a second ferromagnetic material and having a second magnetization direction fixed substantially in a direction opposite to the first magnetization direction;

a memory layer disposed between the first fixed layer and the second fixed layer, the memory layer including a third ferromagnetic material and having a magnetization direction that is variable;

a first intermediate layer disposed between the first fixed layer and the memory layer, the first intermediate layer made essentially of one or more nonmagnetic materials, the nonmagnetic materials including one or both of insulators and semiconductors; and a second intermediate layer disposed between the second fixed layer and the memory layer, the second intermediate layer being nonmagnetic, wherein the magnetization direction of a portion of the memory layer being nearest to the first intermediate layer and the magnetization direction of the first fixed layer are anti-parallel to each other whenever the magnetization direction of a portion of the memory layer being nearest to the second fixed layer and the magnetization direction of the second fixed layer are parallel to each other, and vice versa;

wherein a current is configured to be passed bi-directionally between the first fixed layer and the second fixed layer;

wherein the current is passed in a first direction over a first threshold to make a magnetization direction of the memory layer in the first direction;

wherein the current is passed in a second direction over a second threshold to make the magnetization direction of the memory layer in the direction opposite to the first direction;

wherein a current is passed between the first fixed layer and the second fixed layer to detect the magnetization direction of the memory layer;

wherein an electric conductivity of a nonmagnetic material to constitute the first intermediate layer is lower than an electric conductivity of a nonmagnetic material to constitute the second intermediate layer;

wherein a thickness of the first intermediate layer is 1 nm or less;

wherein the first fixed layer includes N first ferromagnetic sublayers (N is an integer of 1 or more);

wherein the second fixed layer includes M second ferromagnetic sublayers (M is an integer of 1 or more);

wherein the memory layer includes P memory ferromagnetic sublayers (P is an integer of 1 or more); and wherein the mathematical formula 2 including the function $\phi(a, b, d)$ defined by the mathematical formula 1 is satisfied by $a_{1i}$, $b_{1i}$, $t_{2j}$, $a_{2j}$, $b_{2j}$, $t_{2j}$, $d_{1ik}$, $d_{2jk}$, $M_{1i}$, $M_{2j}$, $M_{sk}$ and $H_{Kk}$, when an i-th first ferromagnetic sublayer of the N first ferromagnetic sublayers is approximated by a i-th first rectangular parallelepiped;

a j-th second ferromagnetic sublayer of the M second ferromagnetic sublayers is approximated by a j-th second rectangular parallelepiped;

$a_{1i}$, $b_{1i}$ and $t_{1i}$ represent a height, a width and a thickness of the i-th first rectangular parallelepiped, respectively;

$M_{1i}$ represents saturation magnetization of the i-th first ferromagnetic sublayer;

$a_{2j}$, $b_{2j}$, and $t_{2j}$ represent a height, a width and a thickness of the j-th second rectangular parallelepiped, respectively;

$M_{2j}$ represents saturation magnetization of the j-th second ferromagnetic sublayer;

$M_{sk}$ and $H_{Kk}$ represent saturation magnetization and an anisotropy field of a k-th memory ferromagnetic layer of the P memory ferromagnetic sublayers, respectively;

$d_{1ik}$ represents a distance between the i-th first ferromagnetic sublayer and the k-th memory ferromagnetic sublayer;

$d_{2jk}$ represents a distance between the j-th second ferromagnetic sublayer and the k-th memory ferromagnetic sublayer, $$\phi(a, b, d) = \frac{2}{\pi} \times \arctan\left(\frac{ab}{2d\sqrt{a^2 + b^2 + 4d^2}}\right) \quad [\text{formula 1}]$$

-continued $$0.75 \times \sum_{k=1}^{P} \sum_{i=1}^{N} 2\pi M_{1i} \begin{pmatrix} \phi(a_{1i}, b_{1i}, d_{1ik}) - \\ \phi(a_{1i}, b_{1i}, t_{1i} + d_{1ik}) \end{pmatrix} - $$

$$0.75 \times \sum_{k=1}^{P} \sum_{j=1}^{M} 2\pi M_{2j} \begin{pmatrix} \phi(a_{2j}, b_{2j}, d_{2jk}) - \\ \phi(a_{2j}, b_{2j}, t_{2j} + d_{2jk}) \end{pmatrix} \ge $$

$$0.18 \times \sum_{k=1}^{P} (H_{Kk} - 4\pi M_{Sk}). \quad [\text{formula 2}]$$

4. A magnetic memory apparatus comprising a plurality of word lines, a plurality of bit lines and a plurality of the magnetic memory elements according to claim 3, wherein one of the magnetic memory elements is selected by selecting one of the word lines and one of the bit lines to pass a current between the first fixed layer and the second fixed layer of the selected magnetic memory element, the current allowing detection of a magnetoresistance effect between the memory layer and the first fixed layer.

5. A magnetic memory element, comprising:
a multilayer including:
a working surface;
a first fixed layer including a first ferromagnetic material and having a first magnetization direction fixed substantially perpendicular to the working surface;
a second fixed layer including a second ferromagnetic material and having a second magnetization direction fixed substantially in a direction opposite to the first magnetization direction;
a memory layer disposed between the first fixed layer and the second fixed layer, the memory layer including a third ferromagnetic material and having a magnetization direction that is variable;
a first intermediate layer disposed between the first fixed layer and the memory layer, the first intermediate layer made essentially of one or more nonmagnetic materials, the nonmagnetic materials including one or both of insulators and semiconductors; and
a second intermediate layer disposed between the second fixed layer and the memory layer, the second intermediate layer being nonmagnetic, wherein the magnetization direction of a portion of the memory layer being nearest to the first intermediate layer and the magnetization direction of the first fixed layer are anti-parallel to each other whenever the magnetization direction of a portion of the memory layer being nearest to the second fixed layer and the magnetization direction of the second fixed layer are parallel to each other, and vice versa;

wherein a current is configured to be passed bi-directionally between the first fixed layer and the second fixed layer;

wherein the current is passed in a first direction over a first threshold to make a magnetization direction of the memory layer in the first direction;

wherein the current is passed in a second direction over a second threshold to make the magnetization direction of the memory layer in the direction opposite to the first direction;

wherein a current is passed between the first fixed layer and the second fixed layer to detect the magnetization direction of the memory layer;

wherein an electric conductivity of a nonmagnetic material to constitute the first intermediate layer is lower than an electric conductivity of a nonmagnetic material to constitute the second intermediate layer;

wherein a thickness of the first intermediate layer is 1 nm or less;

wherein the first fixed layer includes N first ferromagnetic sublayers (N is an integer of 1 or more);

wherein the second fixed layer includes M second ferromagnetic sublayers (M is an integer of 1 or more);

wherein the memory layer includes P memory ferromagnetic sublayers (P is an integer of 1 or more); and wherein the mathematical formula 3 including the function $\phi(a, b, d)$ defined by the mathematical formula 1 is satisfied by $a_{1i}$, $b_{1i}$, $t_{1i}$, $a_{2j}$, $t_{2j}$, $d_{1ik}$, $d_{2jk}$, $M_{1i}$, $M_{2j}$, $M_{sk}$ and $H_{Kk}$, when an i-th first ferromagnetic sublayer of the N first ferromagnetic sublayers is approximated by a i-th first rectangular parallelepiped;

a j-th second ferromagnetic sublayer of the M second ferromagnetic sublayers is approximated by a j-th second rectangular parallelepiped;

$a_{1i}$, $b_{1i}$ and $t_{1i}$ represent a height, a width and a thickness of the i-th first rectangular parallelepiped, respectively;

$M_{1i}$ represents saturation magnetization of the i-th first ferromagnetic sublayer;

$a_{2j}$, $b_{2j}$ and $t_{2j}$ represent a height, a width and a thickness of the j-th second rectangular parallelepiped, respectively;

$M_{2j}$ represents saturation magnetization of the j-th second ferromagnetic sublayer;

$M_{sk}$ and $H_{Kk}$ represent saturation magnetization and an anisotropy field of a k-th memory ferromagnetic layer of the P memory ferromagnetic sublayers, respectively;

$d_{1ik}$ represents a distance between the i-th first ferromagnetic sublayer and the k-th memory ferromagnetic sublayer;

$d_{2jk}$ represents a distance between the j-th second ferromagnetic sublayer and the k-th memory ferromagnetic sublayer, $$\phi(a, b, d) = \frac{2}{\pi} \times \arctan\left(\frac{ab}{2d\sqrt{a^2 + b^2 + 4d^2}}\right) \quad \text{[formula 1]}$$

$$0.75 \times \sum_{k=1}^{P} \sum_{i=1}^{N} 2\pi M_{1i} \binom{\phi(a_{1i}, b_{1i}, d_{1ik}) -}{\phi(a_{1i}, b_{1i}, t_{1i} + d_{1ik})} - \quad \text{[formula 3]}$$

$$0.75 \times \sum_{k=1}^{P} \sum_{j=1}^{M} 2\pi M_{2j} \binom{\phi(a_{2j}, b_{2j}, d_{2jk}) -}{\phi(a_{2j}, b_{2j}, t_{2j} + d_{2jk})} \geq$$

$$0.052 \times \sum_{k=1}^{P} (H_{Kk} - 4\pi M_{Sk}).$$

6. A magnetic memory apparatus comprising a plurality of word lines, a plurality of bit lines and a plurality of the magnetic memory elements according to claim 5, wherein one of the magnetic memory elements is selected by selecting one of the word lines and one of the bit lines to pass a current between the first fixed layer and the second fixed layer of the selected magnetic memory element, the current allowing detection of a magnetoresistance effect between the memory layer and the first fixed layer.

* * * * *